United States Patent
Maki et al.

(10) Patent No.: US 10,348,318 B2
(45) Date of Patent: Jul. 9, 2019

(54) LIGHT-EMITTING ELEMENT MODULE, ATOMIC OSCILLATOR, AND ELECTRONIC APPARATUS

(71) Applicant: Seiko Epson Corporation, Tokyo (JP)

(72) Inventors: Yoshiyuki Maki, Suwa (JP); Tsunenori Shibata, Minowa (JP); Koji Chindo, Suwa (JP)

(73) Assignee: Seiko Epson Corporation (JP)

( * ) Notice: Subject to any disclaimer, the term of this patent is extended or adjusted under 35 U.S.C. 154(b) by 114 days.

(21) Appl. No.: 15/695,344

(22) Filed: Sep. 5, 2017

(65) Prior Publication Data

US 2018/0069558 A1    Mar. 8, 2018

(30) Foreign Application Priority Data

Sep. 7, 2016  (JP) ................................ 2016-174920
Feb. 22, 2017 (JP) ................................ 2017-031401

(51) Int. Cl.
| | |
|---|---|
| H03L 7/26 | (2006.01) |
| G04F 5/14 | (2006.01) |
| H01S 5/022 | (2006.01) |
| H01S 5/024 | (2006.01) |
| H01S 5/06 | (2006.01) |
| H01S 5/068 | (2006.01) |

(Continued)

(52) U.S. Cl.
CPC ............... *H03L 7/26* (2013.01); *G04F 5/145* (2013.01); *H01S 5/022* (2013.01); *H01S 5/02296* (2013.01); *H01S 5/02453* (2013.01); *H01S 5/0612* (2013.01); *H01S 5/06804* (2013.01); *H03L 1/02* (2013.01); *H01L 2224/48137* (2013.01); *H01S 5/02276* (2013.01); *H01S 5/183* (2013.01)

(58) Field of Classification Search
CPC ......................................................... H03L 7/26
USPC .................................................... 331/94.1, 3
See application file for complete search history.

(56) References Cited

U.S. PATENT DOCUMENTS

| | | |
|---|---|---|
| 6,320,472 B1 | 11/2001 | Vanier |
| 2002/0163394 A1 | 11/2002 | Hollberg et al. |

(Continued)

FOREIGN PATENT DOCUMENTS

JP    07-098881 A    4/1995

OTHER PUBLICATIONS

S. Knappe, "MEMS Atomic Clocks", National Institute of Standards and Technology (NIST), Boulder, CO, Published by Elsevier B.V., Comprehensive Microsystems, vol. 3, pp. 571-612, Dec. 19, 2007.

(Continued)

*Primary Examiner* — Joseph Chang
(74) *Attorney, Agent, or Firm* — Harness, Dickey & Pierce, P.L.C.

(57) ABSTRACT

A light-emitting element module includes a light-emitting element that emits light, a base that has a depression portion in which the light-emitting element is accommodated, and a lid that covers an opening of the depression portion and is joined to the base. The lid includes a protrusion portion that protrudes on an opposite side to the base and has a hole through which the light passes and a window that is installed in the protrusion portion to block the hole and transmits the light. A surface of the window on a side of the light-emitting element is inclined with respect to a surface perpendicular to an optical axis of the light.

12 Claims, 14 Drawing Sheets

(51) Int. Cl.
*H03L 1/02* (2006.01)
*H01S 5/183* (2006.01)

(56) References Cited

U.S. PATENT DOCUMENTS

| | | |
|---|---|---|
| 2006/0051883 A1 | 3/2006 | Mescher et al. |
| 2010/0102893 A1* | 4/2010 | Chindo .................... H03L 7/26 331/94.1 |
| 2011/0187465 A1 | 8/2011 | Youngner et al. |
| 2014/0232479 A1* | 8/2014 | Maki ........................ H01S 1/06 331/94.1 |

OTHER PUBLICATIONS

J. Coffer Et Al, "Diode Laser Linewidth and Phase Noise to Intensity Noise Conversion in the Gas-Cell Atomic Clock", The Aerospace Corporation, El Segundo, CA, 1998 IEEE International Frequency Control Symposium, pp. 52-56, 1998.

* cited by examiner

LIGHT-EMITTING ELEMENT MODULE, ATOMIC OSCILLATOR, AND ELECTRONIC APPARATUS

This application claims priority to Japanese Patent Application No. 2016-174920, filed Sep. 7, 2016, and Japanese Patent Application No. 2017-031401, filed Feb. 22, 2017, the entirety of which are hereby incorporated by reference.

BACKGROUND

1. Technical Field

The present disclosure relates to a light-emitting element module, an atomic oscillator, and an electronic apparatus.

2. Related Art

In the related art, for example, light-emitting element modules including light-emitting elements that emit laser light are known.

As a light-emitting element module, for example, there is known an optical pickup device including an optical unit that includes a semiconductor laser, a laser medium excited by laser light from the semiconductor laser, and an optical element converting a wavelength of the laser light from the laser medium and a package that accommodates the optical unit (see JP-A-7-98881). In such an optical pickup device, a window is installed in the package and the laser light with a converted wavelength from the optical element is emitted out of the package via the window.

However, in the optical pickup device according to JP-A-7-98881, the window installed in the package is installed to be orthogonal to an emission direction of the laser light. Therefore, the laser light (reflected light) reflected from the window may return to the semiconductor laser in the package. Thus, there is a problem that stability (particularly, stability of the wavelength) of the laser light emitted from the semiconductor laser deteriorates.

In recent years, with miniaturization of apparatuses on which light-emitting element modules are mounted, there has been a high request for miniaturizing the light-emitting element modules.

SUMMARY

An advantage of some aspects of the disclosure is that it provides a light-emitting element module capable of reducing an influence of a return light on a light-emitting element while reducing an increase in its size and provides an atomic oscillator, an electronic apparatus, and a vehicle including the light-emitting element module.

The advantage can be achieved by the following configurations.

A light-emitting element module according to an aspect of the disclosure includes a light-emitting element that emits light, a base that has a depression portion in which the light-emitting element is accommodated, and a lid that covers an opening of the depression portion and is joined to the base. The lid includes a protrusion portion that protrudes on an opposite side to the base and has a hole through which the light passes and a window that is installed in the protrusion portion to block the hole and transmits the light. A surface of the window on a side of the light-emitting element is inclined with respect to a surface perpendicular to an optical axis of the light.

In the light-emitting element module according to the aspect of the disclosure, the surface of the window on the side of the light-emitting element is inclined with respect to the surface perpendicular to the optical axis a of the light. Therefore, it is possible to reduce return light returning to the light-emitting element by reflecting the light from the light-emitting element to the window. Further, since the window is installed in the protrusion portion, a distance between the window and the light-emitting element can be increased. Therefore, it is possible to lower a light amount density and thus effectively reduce the return light in association with traveling of the light from the light-emitting element. In the light-emitting element module, by installing the window in the protrusion portion of the lid, it is possible to miniaturize the entire light-emitting element module further than, for example, when the lid does not include the protrusion portion and the depression portion of the base is enlarged (deepened) to increase the separation distance between the window and the light-emitting element. In this way, in the light-emitting element module, it is possible to reduce the influence of the return light on the light-emitting element while reducing an increase in its size.

In the light-emitting element module according to the aspect of the disclosure, it is preferable that an inclination angle of the surface of the window with respect to the surface perpendicular to the optical axis of the light is equal to or greater than 5° and equal to or less than 45°.

With this configuration, in the relatively simple configuration, it is possible to reduce an influence of the return light on the light-emitting element while exerting optical characteristics necessary for the window.

In the light-emitting element module according to the aspect of the disclosure, it is preferable that the lid includes a first portion supporting the protrusion portion, and a second portion joined to the base and having a thickness thinner than the first portion.

With this configuration, since the second portion joined to the base is thinner than the first portion, it is possible to easily join the lid to the base by seam welding or the like. In addition, since the first portion is thicker than the second portion, it is possible to ensure a necessary mechanical strength of the lid. In addition, since the first portion is thicker than the second portion, it is possible to reduce stress occurring in the first portion at the time of joining the base to the lid.

In the light-emitting element module according to the aspect of the disclosure, it is preferable that a part of an outer circumferential surface of the protrusion portion has a flat portion that is flat and formed along an external shape of the first portion when viewed in a direction along the optical axis of the light.

With this configuration, when the base and the second portion of the lid are joined, it is possible to reduce interference of the protrusion portion. Therefore, the lid and the base can be joined more easily.

In the light-emitting element module according to the aspect of the disclosure, it is preferable that an inner wall surface of the hole of the protrusion portion includes a stepped portion that is inclined with respect to the surface perpendicular to the optical axis of the light and supports the window.

With this configuration, it is easy to dispose the window at an appropriate position and inclination angle with respect to the protrusion portion.

In the light-emitting element module according to the aspect of the disclosure, it is preferable that, when W [mm] is a width of the light on a surface along the opening of the hole on the side of the base at an intensity of $1/e^2$ (where e is a base of natural logarithm) of a peak intensity of the light, a width L [mm] of the opening of the hole on the side of the base satisfies W<L<20×W.

With this configuration, it is possible to cause a portion (the central portion) of the light emitted from the optical element except for a portion (the outer circumference) in which a change in an energy density is large to be effectively incident on the hole while reducing an excessive increase in the size of the protrusion portion.

In the light-emitting element module according to the aspect of the disclosure, it is preferable that a center of the window deviates from the optical axis of the light.

With this configuration, it is possible to reduce occurrence of light not passing through the window while reducing an increase in the size of the window. Therefore, it is possible to reduce an adverse influence on the light-emitting element or the like due to diffused reflection of light deviating from the window while reducing an increase in the size of the light-emitting element module.

In the light-emitting element module according to the aspect of the disclosure, it is preferable that a side surface of the window is located further outwards than a light flux of the light.

With this configuration, it is possible to pass the light inside both main surfaces of the window, and thus it is possible to reduce diffused reflection of the light on the side surface of the window.

An atomic oscillator according to an aspect of the disclosure includes the light-emitting element module according to the aspect of the disclosure.

The atomic oscillator includes the light-emitting element module capable of reducing the influence of the return light on the light-emitting element while reducing an increase in its size. Therefore, it is possible to reduce a variation in the wavelength of the light from the light-emitting element, and thus realize the atomic oscillator having excellent oscillation characteristics using the light.

It is preferable that the atomic oscillator according to the aspect of the disclosure further includes an optical element that passes the light from the light-emitting element and a holder that holds the optical element, and the holder has a through-hole into which the protrusion portion included in the light-emitting element module can be inserted.

With this configuration, by inserting the protrusion portion into the through-hole of the holder, it is possible to relatively position the light-emitting element module and the holder simply and with high precision. Therefore, the light emitted from the light-emitting element module can be appropriately incident on the optical element.

In the atomic oscillator according to the aspect of the disclosure, it is preferable that the window is disposed between the light-emitting element and the optical element, a surface of the optical element on a side of the window is inclined with respect to a surface perpendicular to an optical axis of the light, and a center of the optical element deviates from the optical axis of the light. With this configuration, it is possible to reduce occurrence of light not passing through the optical element while reducing an increase in the size of the optical element.

An electronic apparatus according to an aspect of the disclosure includes the light-emitting element module according to the aspect of the disclosure.

The electronic apparatus includes the light-emitting element module capable of reducing the influence of the return light on the light-emitting element while reducing an increase in its size. Therefore, it is possible to realize the electronic apparatus with high characteristics using high-quality light.

A vehicle according to an aspect of the disclosure includes the light-emitting element module according to the aspect of the disclosure.

The vehicle includes the light-emitting element module capable of reducing the influence of the return light on the light-emitting element while reducing an increase in its size. Therefore, it is possible to realize the vehicle with high characteristics using high-quality light.

BRIEF DESCRIPTION OF THE DRAWINGS

The disclosure will be described with reference to the accompanying drawings, wherein like numbers reference like elements.

DESCRIPTION OF EXEMPLARY EMBODIMENTS

Hereinafter, a light-emitting element module, an atomic oscillator, an electronic apparatus, and a vehicle according to the disclosure will be described with reference to the appended drawings according to embodiments.

1. Atomic Oscillator

First, an atomic oscillator (an atomic oscillator including a light-emitting element module according to the disclosure) according to the disclosure will be described.

First Embodiment

Figure 1:
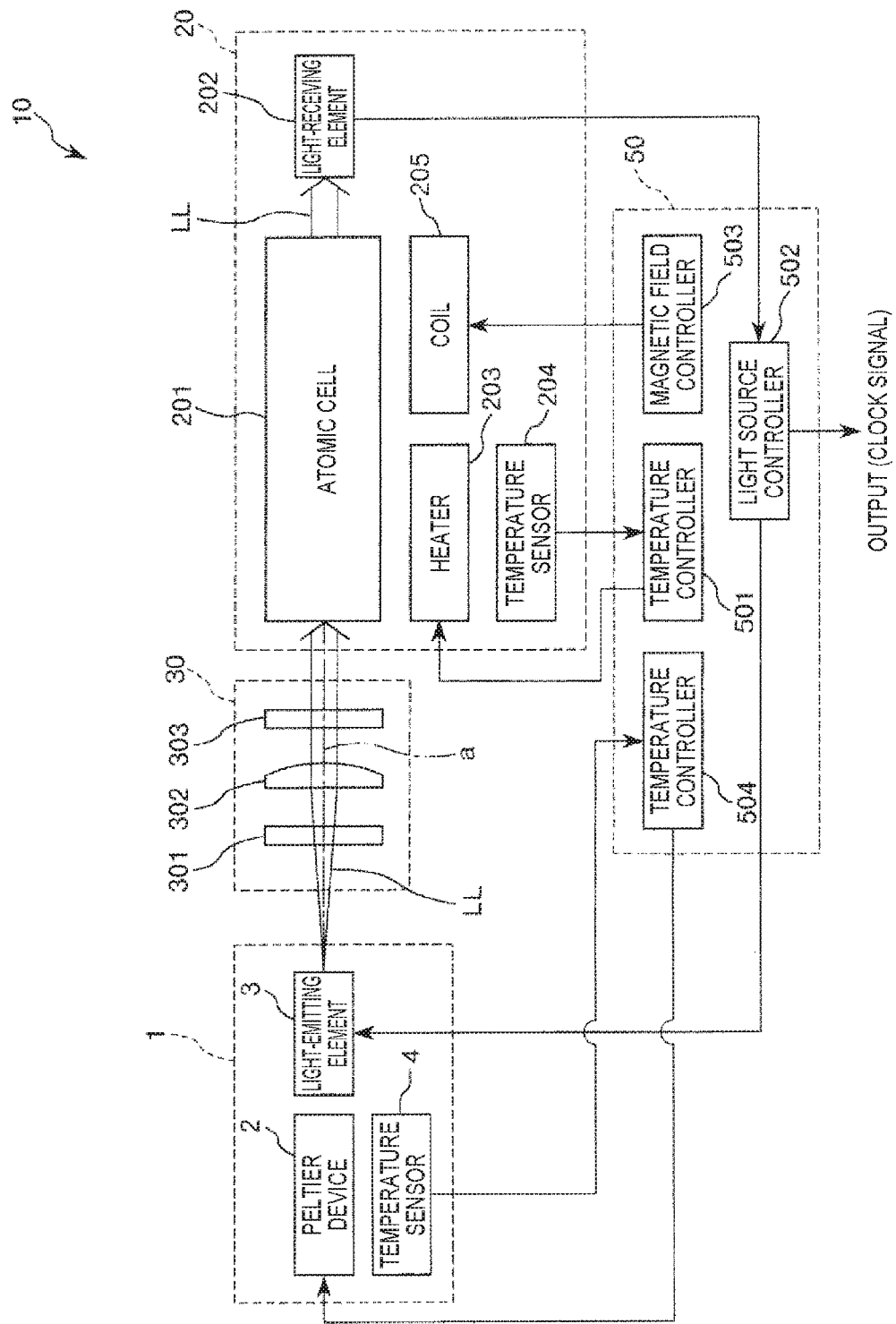
FIG. 1 is a schematic diagram illustrating an atomic oscillator according to a first embodiment.

FIG. 1 is a schematic diagram illustrating anatomic oscillator according to a first embodiment.

An atomic oscillator 10 illustrated in FIG. 1 is an atomic oscillator that uses coherent population trapping (CPT) in which a phenomenon occurs in which two pieces of resonance light are transmitted without being absorbed by alkali metal atoms when the two pieces of resonance light with specific different wavelengths are simultaneously radiated to the alkali metal atoms. The phenomenon of the coherent population trapping is also called an electromagnetically induced transparency (EIT) phenomenon.

As illustrated in FIG. 1, the atomic oscillator 10 includes a light-emitting element module 1, an atomic cell unit 20, an optical system unit 30 installed between the light-emitting element module 1 and the atomic cell unit 20, and a controller 50 that controls operations of the light-emitting element module 1 and the atomic cell unit 20. Hereinafter, an overview of the atomic oscillator 10 will be described first.

The light-emitting element module 1 includes a Peltier device 2, a light-emitting element 3, and a temperature sensor 4. The light-emitting element 3 emits linearly polarized light LL containing two types of light with different frequencies. The light LL (light flux) emitted by the light-emitting element 3 is emitted to spread at a predetermined angle of radiation. The cross-sectional intensity distribution of the emitted light LL forms a Gaussian distribution. Here, the "angle of radiation" indicates a spreading angle when an optical axis a of the light LL is a central axis. Specifically, the "angle of radiation" refers to an angle at $1/e^2$ of a peak intensity of the light LL. When the cross-sectional intensity distribution of the light LL does not form the Gaussian distribution, the "angle of radiation" refers to an angle at half of the peak intensity of the light LL. A portion inside the angle of radiation of the light LL is referred to as a light flux. The temperature sensor 4 detects temperature of the light-emitting element 3. The Peltier device 2 adjusts the temperature of the light-emitting element 3 (heats or cools the light-emitting element 3).

The optical system unit 30 includes a light reduction filter 301 (optical element), a lens 302 (optical element), and a quarter wavelength plate 303 (optical element). The light reduction filter 301 reduces the intensity of the light LL from the above-described light-emitting element 3. The lens 302 adjusts the angle of radiation of the light LL (for example, adjusts the light LL to parallel light). The quarter wavelength plate 303 converts two types of light with different frequencies contained in the light LL from linearly polarized light to circularly polarized light (right-handed circularly polarized light or left-handed circularly polarized light).

The atomic cell unit 20 includes an atomic cell 201, a light-receiving element 202, a heater 203, a temperature sensor 204, and a coil 205.

The atomic cell 201 has light transmittance and alkali metal is sealed inside the atomic cell 201. An alkali metal atom has energy levels of three level systems formed by two different ground levels and an excited level. The light LL from the light-emitting element 3 is incident on the atomic cell 201 via the light reduction filter 301, the lens 302, and the quarter wavelength plate 303. Then, the light-receiving element 202 receives and detects the light LL passing through the atomic cell 201.

The heater 203 heats the alkali metal inside the atomic cell 201 to change at least a part of the alkali metal into a gas state. The temperature sensor 204 detects temperature of the atomic cell 201. The coil 205 applies a magnetic field in a predetermined direction to the alkali metal inside the atomic cell 201 to perform Zeeman splitting on the energy levels of the alkali metal atoms. When the pair of pieces of circularly polarized resonance light described above are radiated to the alkali metal atoms in a state in which the alkali metal atoms are subjected to the Zeeman splitting in this way, the number of alkali metal atoms in a particular energy level among the plurality of levels at which the alkali metal atoms are subjected to the splitting can be relatively greater than the number of alkali metal atoms at another energy level. Therefore, it is possible to increase the number of atoms realizing a particular EIT phenomenon, raise a particular EIT signal, and consequently improve an oscillation property of the atomic oscillator 10.

The controller 50 includes a temperature controller 501, a light source controller 502, a magnetic field controller 503, and a temperature controller 504. Based on a detection result of the temperature sensor 204, the temperature controller 501 controls electrification to the heater 203 such that a preferred temperature is maintained inside the atomic cell 201. The magnetic field controller 503 controls electrification to the coil 205 such that the magnetic field generated by the coil 205 is constant. Based on a detection result of the temperature sensor 4, the temperature controller 504 controls electrification to the Peltier device 2 such that the temperature of the light-emitting element 3 is maintained at a preferred temperature (within a temperature region).

Based on a detection result of the light-receiving element 202, the light source controller 502 controls the frequencies of two types of light contained in the light LL from the light-emitting element 3 such that an EIT phenomenon occurs. Here, the EIT phenomenon occurs when the two types of light become the pair of pieces of resonance light with a frequency difference equivalent to an energy difference between two ground levels of the alkali metal atoms inside the atomic cell 201. The light source controller 502 includes a voltage controlled crystal oscillator (not illustrated) of which an oscillation frequency is controlled for stabilization in synchronization with control of the frequencies of the two types of light described above and outputs an output signal of the voltage controlled crystal oscillator (VCXO) as an output signal (clock signal) of the atomic oscillator 10.

An overview of the atomic oscillator 10 has been described. Hereinafter, a more specific configuration of the atomic oscillator 10 will be described with reference to FIGS. 2 and 3.

Figure 2:
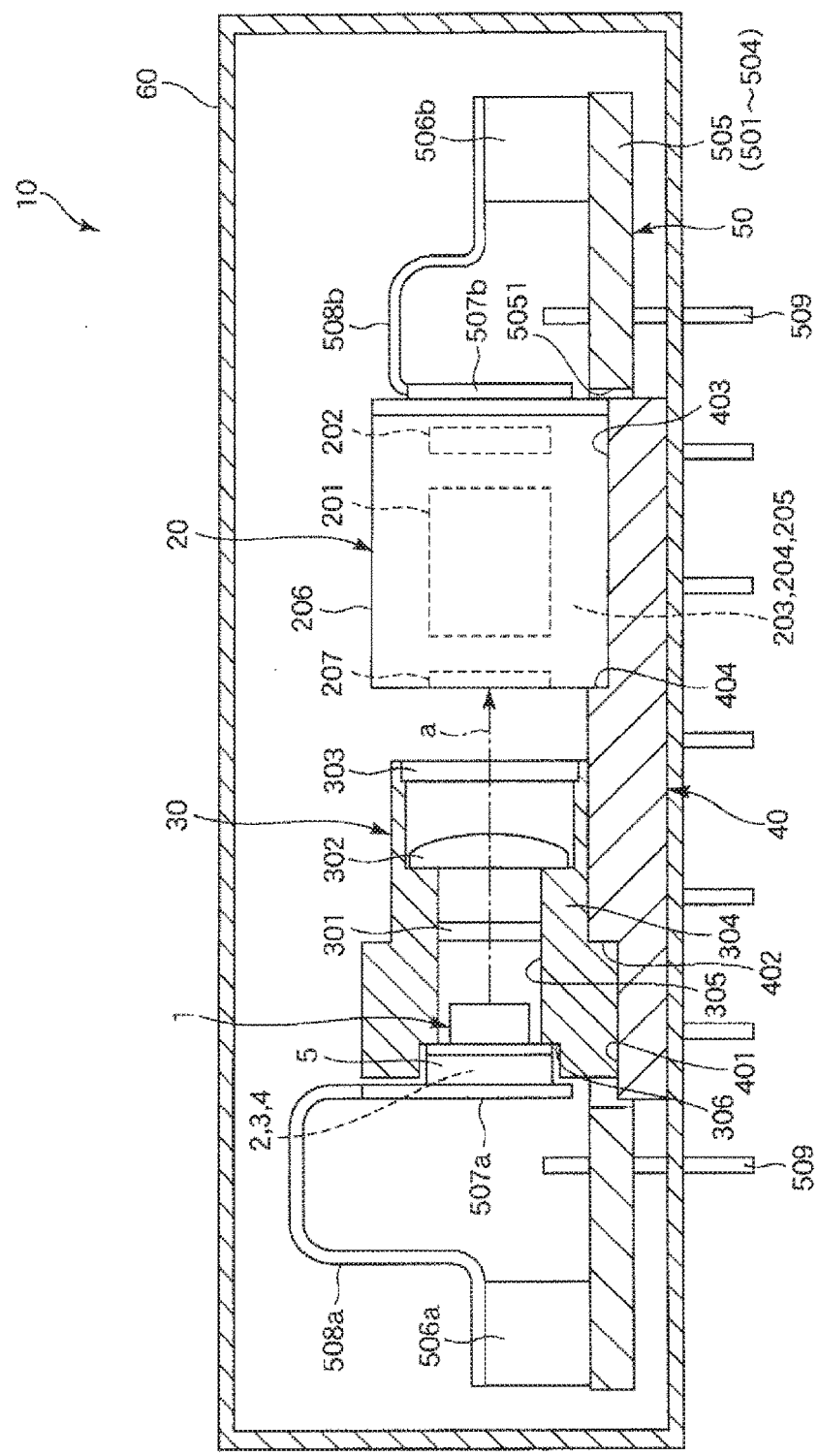
FIG. 2 is a sectional side view illustrating the atomic oscillator illustrated in FIG. 1.
Figure 3:
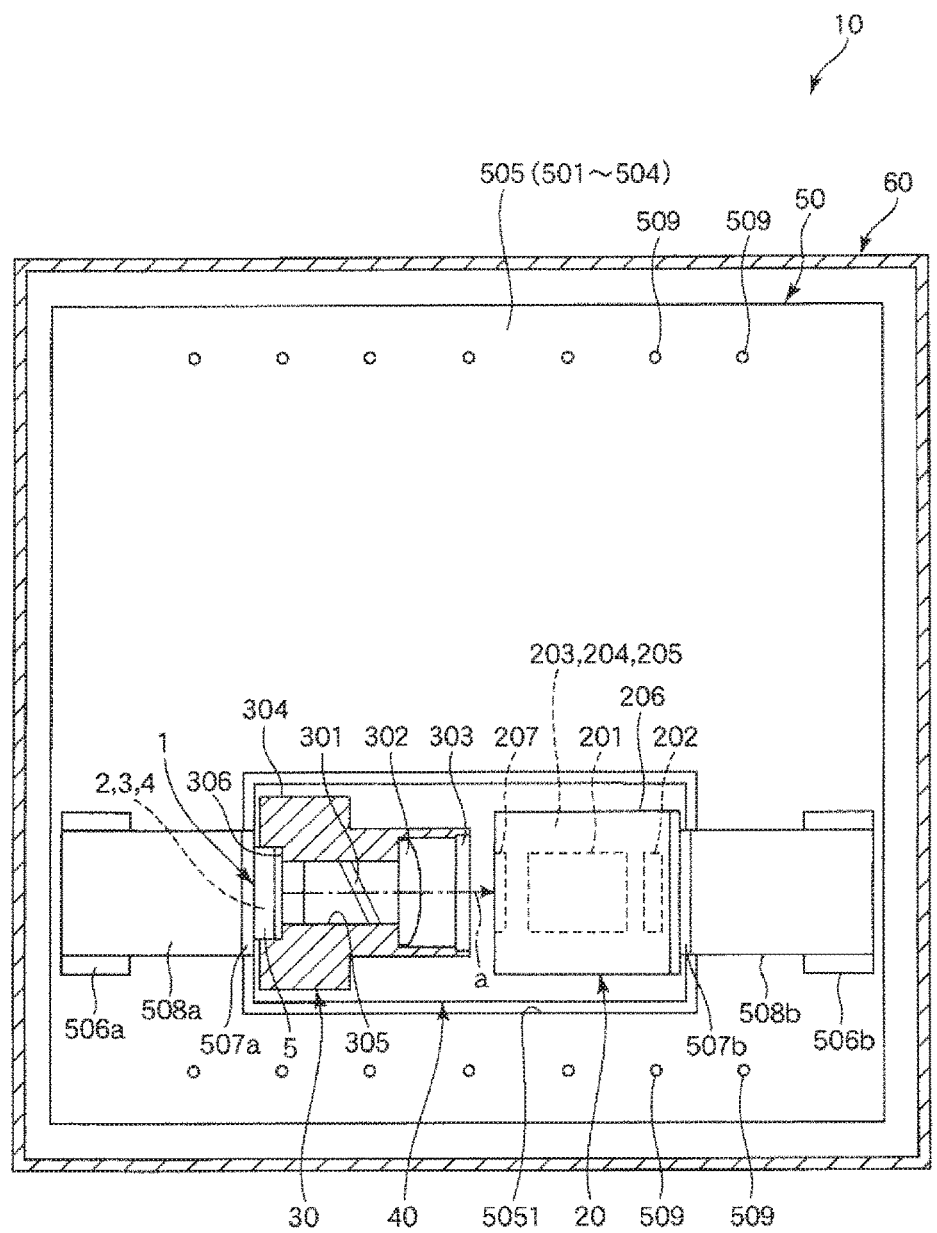
FIG. 3 is a plan view illustrating the atomic oscillator illustrated in FIG. 2.

FIG. 2 is a sectional side view illustrating the atomic oscillator illustrated in FIG. 1. FIG. 3 is a plan view illustrating the atomic oscillator illustrated in FIG. 2. Hereinafter, the upper side in FIG. 2 is referred to as a "top" and the lower side is referred to as a "bottom" to facilitate the description.

As illustrated in FIG. 2, the atomic oscillator 10 includes the light-emitting element module 1, the atomic cell unit 20, the optical system unit 30 that holds the light-emitting element module 1, a hold member 40 that collectively holds the atomic cell unit 20 and the optical system unit 30, the controller 50 that is electrically connected to the light-emitting element module 1 and the atomic cell unit 20, and a package 60 that accommodates them.

The light-emitting element module 1 includes the Peltier device 2, the light-emitting element 3, the temperature sensor 4, and a package 5 accommodating them. The light-emitting element module 1 will be described below in detail.

The optical system unit 30 includes the light reduction filter 301, the lens 302, the quarter wavelength plate 303, and a holder 304 that holds them. Here, the holder 304 includes through-holes 305 with a pillar shape of which both ends are open. The through-hole 305 is a passage region of the light LL. The light reduction filter 301, the lens 302, and the quarter wavelength plate 303 are disposed in this order inside the through-hole 305. As illustrated in FIG. 3, the light reduction filter 301 is fixed to the holder 304 by an adhesive or the like (not illustrated) to be inclined with respect to a surface that has the optical axis a as a normal line (a surface perpendicular to the optical axis of the light). The lens 302 and the quarter wavelength plate 303 are fixed to the holder 304 by an adhesive or the like (not illustrated) along a surface that has the optical axis a as a normal line (surface perpendicular to the optical axis). The light-emitting element module 1 is mounted on an end of the through-hole 305 close to the light reduction filter 301 (the left of FIG. 2) by a mounting member (not illustrated). The holder 304 is formed of, for example, a metal material such as aluminum and has a heat dissipation property. In this way, it is possible to efficiently dissipate the heat from the light-emitting element module 1.

The optical system unit 30 may not include at least one of the light reduction filter 301 and the lens 302 depending on the intensity of the light LL from the light-emitting element 3, an angle of radiation, or the like. The optical system unit 30 may include an optical element other than the light reduction filter 301, the lens 302, and the quarter wavelength plate 303. The disposition order of the light reduction filter 301, the lens 302, and the quarter wavelength plate 303 is not limited to the illustrated order and the light reduction filter 301, the lens 302, and the quarter wavelength plate 303 may be disposed in any order.

The atomic cell unit 20 includes the atomic cell 201, the light-receiving element 202, the heater 203, the temperature sensor 204, the coil 205, and a package 206 that accommodates them.

An alkali metal such as rubidium, cesium, or sodium in a gaseous form is sealed inside the atomic cell 201. In the atomic cell 201, a noble gas such as argon or neon or an inert gas such as nitrogen may be sealed as a buffer gas along with the alkali metal gas, as necessary.

Although not illustrated, the atomic cell 201 includes, for example, a trunk that has a through-hole with a pillar and one pair of windows (different from windows 56, 56A, and 56B) that form an inner space sealed airtight by sealing both openings of the through-hole of the trunk. Here, the light LL incident on the atomic cell 201 is transmitted through one window between the pair of windows and the light LL emitted from the inside of the atomic cell 201 is transmitted through the other window. Accordingly, a material used to form each window may have transmittance with respect to the light LL and is not particularly limited. For example, a glass material or a crystal can be exemplified. On the other hand, a material used to form the trunk is not particularly limited and a metal material, a resin material, a glass material, a silicon material, and a crystal can be exemplified. From the viewpoint of workability or joining with each window, it is desirable to use a glass material or a silicon material. A method of joining the trunk with each window can be decided according to the material and is not particularly limited. For example, a direct joining method or an anode joining method can be used.

The light-receiving element 202 is disposed to be opposite to the light-emitting element module 1 with respect to the atomic cell 201. The light-receiving element 202 is not particularly limited as long as the light-receiving element can detect the intensity of the light LL (the pair of pieces of resonance light) transmitted through the atomic cell 201. For example, a solar cell or a light detector (light-receiving element) such as a photodiode is exemplified.

Although not illustrated, for example, the heater 203 is disposed on the above-described atomic cell 201 or is connected to the atomic cell 201 via a thermal conductive member such as a metal. The heater 203 is not particularly limited as long as the atomic cell 201 (more specifically, the alkali metal inside the atomic cell 201) can be heated. For example, a Peltier device or any of various heaters having a heating resistor can be exemplified.

Although not illustrated, for example, the temperature sensor 204 is disposed near the atomic cell 201 or the heater 203. The temperature sensor 204 is not particularly limited as long as the temperature of the atomic cell 201 or the heater 203 can be detected. For example, various known temperature sensors such as a thermistor or a thermocouple can be exemplified.

Although not illustrated, for example, the coil 205 is a solenoid type coil disposed to be wound around the outer circumference of the atomic cell 201 or a pair of Helmholtz coils facing each other with the atomic cell 201 interposed therebetween. The coil 205 generates a magnetic field in a direction (a parallel direction) along the optical axis a of the light LL inside the atomic cell 201. In this way, a gap between different energy levels at which the alkali metal atoms inside the atomic cell 201 are degenerated can be spread by Zeeman splitting to improve a resolution and the line width of the EIT signal can be reduced. The magnetic field generated by the coil 205 may be one magnetic field between a direct-current magnetic field and an alternating-current magnetic field or may be a magnetic field in which a direct-current magnetic field and an alternating-current magnetic field are superimposed.

Although not illustrated, the package 206 includes, for example, a plate-shaped substrate and a cover joined to the substrate. An airtight space in which the atomic cell 201, the light-receiving element 202, the heater 203, the temperature sensor 204, and the coil 205 described above are accommodated is formed between the substrate and the cover. Here, the substrate directly or indirectly holds the atomic cell 201, the light-receiving element 202, the heater 203, the temperature sensor 204, and the coil 205. A plurality of terminals electrically connected to the light-receiving element 202, the heater 203, the temperature sensor 204, and the coil 205 are installed on the outer surface of the substrate. On the other hand, the cover forms a bottom cylinder of which one end is open and the opening is blocked by the substrate. A window 207 that has transmission properties for the light LL is installed at the other end (bottom portion) of the cover.

A material of portions other than the window of the cover and the substrate of the package 206 is not particularly limited. For example, a ceramics or a metal can be exemplified. As a material of the window 207, for example, a glass material can be exemplified. A method of joining the substrate to the cover is not particularly limited. For example, soldering, seam welding, or energy line welding (laser welding, electron beam welding, or the like) can be exemplified. The package 206 is internally depressurized than the atmospheric pressure. In this way, it is possible to control the temperature of the atomic cell 201 simply and with high precision. As a result, it is possible to improve the characteristics of the atomic oscillator 10.

The hold member 40 is formed in a plate shape. The atomic cell unit 20 and the optical system unit 30 described above are placed on one surface of the hold member 40. The hold member 40 has an installation surface 401 formed along the shape of the lower surface of the holder 304 of the optical system unit 30. A stepped portion 402 is formed on the installation surface 401. The stepped portion 402 engages with the stepped portion of the lower surface of the holder 304 and regulates movement of the holder 304 toward the side of the atomic cell unit 20 (the right side of FIG. 2). Similarly, the hold member 40 has an installation surface 403 formed along the shape of the lower surface of the package 206 of the atomic cell unit 20. A stepped portion 404 is formed on the installation surface 403. The stepped portion 404 engages with the end surface of the package 206 (the end surface on the left side of FIG. 2) and regulates movement of the package 206 toward the side of the optical system unit 30 (the left side of FIG. 2).

In this way, the hold member 40 can regulate a relative positional relation between the atomic cell unit 20 and the optical system unit 30. Here, since the light-emitting element module 1 is fixed to the holder 304, a relative positional relation of the light-emitting element module 1 relative to the atomic cell unit 20 and the optical system unit 30 is also regulated. Here, the package 206 and the holder 304 are fixed to the hold member 40 by fixing members such as screws (not illustrated), respectively. The hold member 40 is fixed to the package 60 by a fixing member such as a screw (not illustrated). The hold member 40 is formed of, for example, a metal material such as aluminum and has a heat dissipation property. In this way, it is possible to efficiently dissipate the heat from the light-emitting element module 1.

As illustrated in FIG. 3, the controller 50 includes a circuit substrate 505, two connectors 506a and 506b installed on the circuit substrate 505, a rigid wiring substrate 507a connected to the light-emitting element module 1, a rigid wiring substrate 507b connected to the atomic cell unit 20, a flexible wiring substrate 508a connecting the connector 506a to the rigid wiring substrate 507a, a flexible wiring substrate 508b connecting the connector 506b to the rigid wiring substrate 507b, and a plurality of lead pins 509 penetrating the circuit substrate 505.

Here, an integrated circuit (IC) chip (not illustrated) is installed in the circuit substrate 505. The IC chip functions as the temperature controller 501, the light source controller 502, the magnetic field controller 503, and the temperature controller 504 described above. The circuit substrate 505 includes a through-hole 5051 into which the above-described hold member 40 is inserted. The circuit substrate 505 is held by the package 60 via the plurality of lead pins 509. The plurality of lead pins 509 are electrically connected to the circuit substrate 505.

The configuration in which the circuit substrate 505 is electrically connected to the light-emitting element module 1 and the configuration in which the circuit substrate 505 is electrically connected to the atomic cell unit 20 are not limited to the connectors 506a and 506b, the rigid wiring substrates 507a and 507b, and the flexible wiring substrates 508a and 508b illustrated in the drawing, but other known connectors and wirings may be used.

The package 60 is formed of, for example, a metal material such as Kovar and has a magnetic shielding property. In this way, it is possible to reduce an adverse influence of an external magnetic field on the characteristics of the atomic oscillator 10. The package 60 may be internally depressurized or may be at the atmospheric pressure.

Detailed Description of Light-Emitting Element Module

Figure 4:
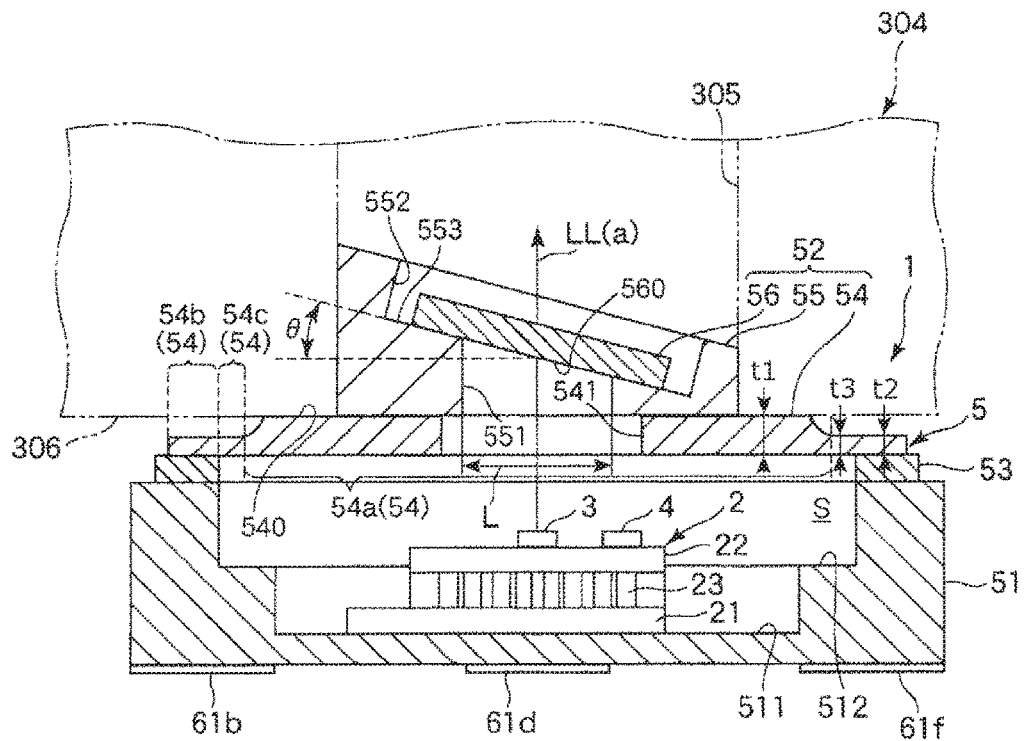
FIG. 4 is a sectional view illustrating a light-emitting element module included in the atomic oscillator illustrated in FIGS. 2 and 3.
Figure 5:
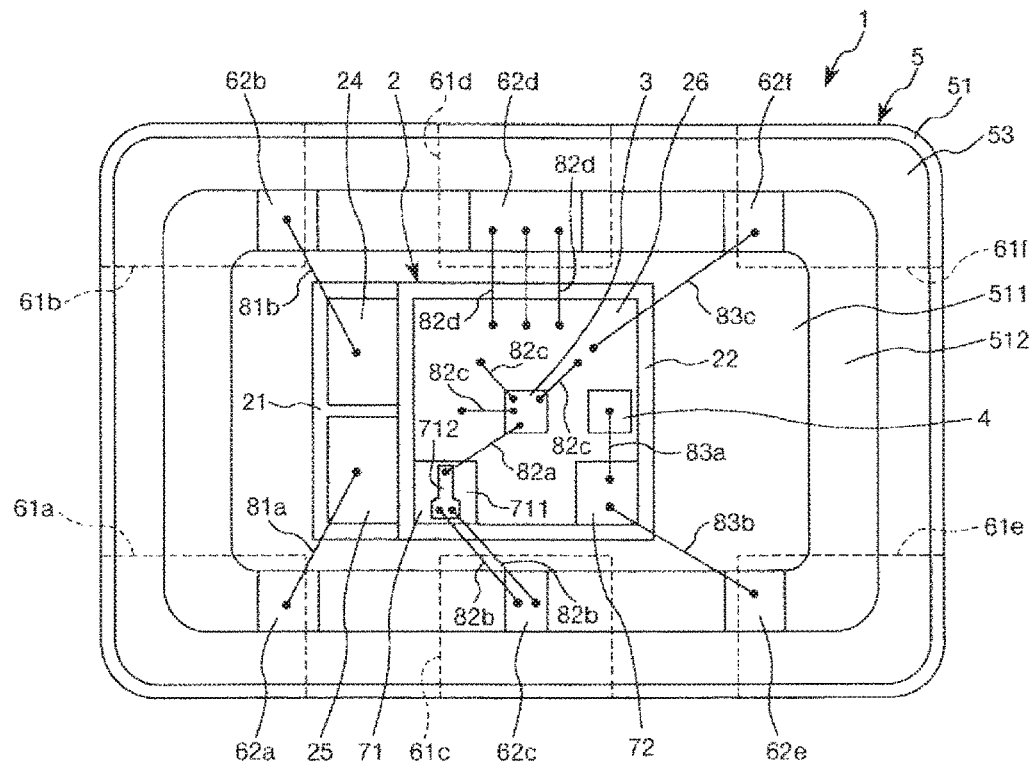
FIG. 5 is a plan view illustrating the light-emitting element module illustrated in FIG. 4.
Figure 6:
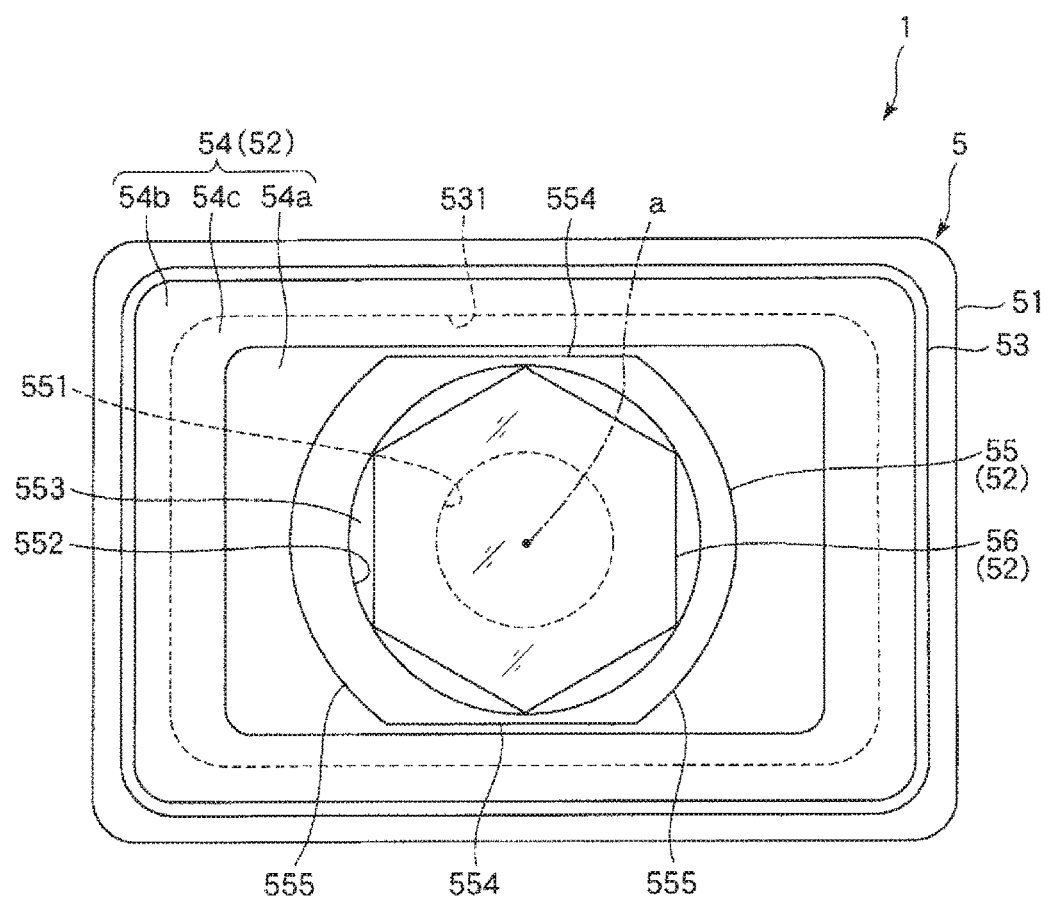
FIG. 6 is a plan view illustrating a lid included in the light-emitting element module illustrated in FIG. 4.

FIG. 4 is a sectional view illustrating the light-emitting element module included in the atomic oscillator illustrated in FIGS. 2 and 3. FIG. 5 is a plan view illustrating the light-emitting element module illustrated in FIG. 4. FIG. 6 is a plan view illustrating a lid included in the light-emitting element module illustrated in FIG. 4. Hereinafter, to facilitate the description, the upper side in FIG. 4 is referred to as a "top" and the lower side is referred to as a "bottom".

As illustrated in FIG. 4, the light-emitting element module 1 includes the Peltier device 2, the light-emitting element 3, the temperature sensor 4, and the package 5 that accommodates them.

The package 5 includes a base 51 that includes a depression portion 511 open toward the upper surface of the base 51 and a lid 52 that blocks an opening (upper opening) of the depression portion 511. An inner space S which is an airtight space in which the Peltier device 2, the light-emitting element 3, and the temperature sensor 4 are accommodated is formed between the base 51 and the lid 52. It is desirable that the package 5 is in a depressurized (vacuum) state internally. In this way, it is possible to reduce an influence of a change in the external temperature of the package 5 on the light-emitting element 3, the temperature sensor 4, or the like inside the package 5 and reduce a variation of the temperature of the light-emitting element 3, the temperature sensor 4, or the like inside the package 5. The package 5 may not be in the depressurized state and an inert gas such as nitrogen, helium, or argon may be sealed.

A material of the base 51 is not particularly limited. A material that has an insulation property and is suitable for forming the inner space S as an airtight space, for example, various kinds of ceramics such as oxide-based ceramics such as alumina, silica, titania, and zirconia, nitride-based ceramics such as silicon nitride, aluminum nitride, and titanium nitride, and carbide-based ceramics such as silicon carbide, can be used.

The base 51 includes a stepped portion 512 that is on the upper side of the bottom surface of the depression portion 511 and is formed to surround the outer circumference of the bottom surface of the depression portion 511. As illustrated in FIG. 5, connection electrodes 62a, 62b, 62c, 62d, 62e, and 62f are installed on the upper surface of the stepped portion 512. The connection electrodes 62a, 62b, 62c, 62d, 62e, and 62f (hereinafter also referred to as "connection electrodes 62a to 62f") are electrically connected to external mounting electrodes 61a, 61b, 61c, 61d, 61e, and 61f (hereinafter also referred to as "external mounting electrodes 61a to 61f) installed on the lower surface of the base 51 via through-electrodes (not illustrated) penetrating the base 51, respectively.

Materials of the connection electrodes 62a to 62f and the external mounting electrodes 61a to 61f are not particularly limited. For example, metal materials such as gold (Au), a gold alloy, platinum (Pt), aluminum (Al), an aluminum alloy, silver (Ag), a sliver alloy, chromium (Cr), a chromium alloy, nickel (Ni), copper (Cu), molybdenum (Mo), niobium (Nb), tungsten (W), iron (Fe), titanium (Ti), cobalt (Co), zinc (Zn), and zirconium (Zr) can be exemplified.

A seal ring 53 with a frame shape (circular shape) is installed on the upper end surface of the base 51. The seal ring 53 is formed of, for example, a metal material such as Kovar and is joined to the base 51 by soldering or the like. The lid 52 is joined to the base 51 via the seal ring 53 by seam welding or the like.

As illustrated in FIGS. 4 and 6, the lid 52 includes a body portion 54 that has a plate shape, a protrusion portion 55 that is installed on the body portion 54 and has a cylindrical shape, and a window 56 that blocks a hole 551 (opening) formed inside the protrusion portion 55.

The body portion 54 includes a first portion 54a that supports the protrusion portion 55, a second portion 54b that is joined to the base 51 (more specifically, the base 51 via the seal ring 53), and a third portion 54c that connects the first portion 54a to the second portion 54b. A plate surface 540 (upper surface) of the body portion 54 is parallel to a surface that has the optical axis a of the light LL emitted from the light-emitting element 3 as a normal line. Here, a thickness t2 of the second portion 54b and a thickness t3 of the third portion 54c are thinner than a thickness t1 of the first portion 54a. The thickness t2 of the second portion 54b is the same as the thickness t3 of the third portion 54c. In the embodiment, when outer circumference of the thickness t2 of the body portion 54 is divided into two portions using an inner circumference edge 531 of the seal ring 53 as a boundary in a plan view, the outer portion of the two portions can be said to be the second portion 54b and the inner portion can be said to be the third portion 54c. The thickness of the outer circumference portion of the first portion 54a is continuously thinned toward the third portion 54c. In this way, the upper surface and the lower surface of the first portion 54a are continuously connected to the upper surface and the lower surface of the third portion 54c. A hole 541 penetrated in the thickness direction is formed in the first portion 54a. At least a part of the light LL from the light-emitting element 3 passes through the hole 541. A material of the body portion 54 is not particularly limited. A metal material is suitably used. It is desirable to use a metal material with a linear expansion coefficient similar to that of the material of the base 51. Accordingly, for example, when the base 51 is formed of a ceramics substrate, it is desirable to use an alloy such as Kovar as the material of the body portion 54.

The protrusion portion 55 is installed in the middle of the first portion 54a and is included in the first portion 54a in a plan view. The protrusion portion 55 includes the hole 551 that communicates with the hole 541 of the above-described body portion 54 and a hole 552 that communicates with the hole 551 opposite to the hole 541 with respect to the hole 551. At least a part of the light LL from the light-emitting element 3 passes through each of the holes 551 and 552. Here, the width (diameter) of the hole 552 is greater than the width (diameter) of the hole 551. In this way, a stepped portion 553 is formed between the holes 551 and 552. The stepped portion 553 is inclined at an inclination angle θ with respect to the plate surface 540 of the above-described body portion 54. In the embodiment, the stepped portion 553 is inclined toward one side (the right side in FIGS. 4 and 6) of a length direction of the lid 52. As illustrated in FIG. 6, the outer circumferential surface of the protrusion portion 55 includes a pair of curve surfaces 555 that are formed along the cylindrical surface and a pair of flat portions 554 that are flat and installed between the pair of curve surfaces 555. The pair of flat portions 554 are formed along the external shape of the first portion 54a of the body portion 54 in a plan view.

A material of the protrusion portion 55 may be different from the material of the body portion 54. However, it is desirable to use a metal material with a linear expansion coefficient similar to that of the material of the body portion 54 and it is more desirable to use the same material as the material of the body portion 54. The protrusion portion 55 may be formed to be separate from the body portion 54 to be joined by a known joining method or may be formed to be integrated (collectively) with the body portion 54 using a mold or the like.

The window 56 formed of a plate-shaped member through which the light LL passes is installed inside the hole 552. The window 56 is joined onto the above-described stepped portion 553 by a known joining method and blocks the opening of the hole 551 of the above-described protrusion portion 55 on the side of the hole 552. Here, since the stepped portion 553 is inclined at the inclination angle θ with respect to the plate surface 540 of the body portion 54, as described above, the window 56 is also inclined at the inclination angle θ with respect to the plate surface 540 of the body portion 54. Accordingly, in the embodiment, a surface 560 (lower surface) of the window 56 on the side of the light-emitting element 3 and a surface (upper surface) opposite to the light-emitting element 3 are inclined toward one side (the right side in FIGS. 4 and 6) of the length direction of the lid 52. The window 56 has a transmission property for the light LL from the light-emitting element 3. A material of the window 56 is not particularly limited. For example, a glass material can be exemplified. The window 56 may be an optical component such as a lens or a light reduction filter.

The shape of the window 56 in a plan view is not particularly limited. In the embodiment, the window 56 is hexagonal in shape. Since the window 56 is hexagonal in shape in the plan view, even when the area of the window 56 is small, the circular opening of the hole 551 can be blocked accurately more than when the window 56 is rectangular in shape in the plan view. For example, when the plurality of windows 56 are cut in one substrate (mother board), unnecessary portions are smaller and more windows 56 can be formed than when the window 56 is circular in shape in the plan view.

On the lid 52, as illustrated in FIG. 4, the body portion 54 and the protrusion portion 55 engage with the holder 304 of the above-described optical system unit 30 to be positioned. More specifically, the protrusion portion 55 is inserted into the through-hole 305 of the holder 304 and the plate surface 540 of the body portion 54 comes into contact with a positioning surface 306 of the holder 304, so that the lid 52 and the light-emitting element module 1 are positioned in a direction of the optical axis a of the light-emitting element 3. When the protrusion portion 55 is inserted into the through-hole 305 of the holder 304 and side surfaces (more specifically, the pair of curve surfaces 555 described above) of the protrusion portion 55 come into contact with the inner wall surface of the through-hole 305, the lid 52 and the light-emitting element module 1 are positioned in a direction vertical to the optical axis a of the light-emitting element 3.

The Peltier device 2 is disposed on the bottom surface of the depression portion 511 of the base 51 of the package 5. The Peltier device 2 is fixed to the base 51 by, for example, an adhesive. As illustrated in FIG. 4, the Peltier device 2 includes a pair of substrates 21 and 22 and a joint 23 installed between the substrates 21 and 22. The substrates 21 and 22 are formed of a material that has excellent thermal conductivity, such as a metal material or a ceramics material. Insulation films are formed on the surfaces of the substrates 21 and 22, as necessary. The lower surface of the substrate 21 is fixed to the base 51 of the package 5. On the other hand, a pair of terminals 24 and 25 are installed on the upper surface of the substrate 21, as illustrated in FIG. 5. The substrate 22 is installed so that the pair of terminals 24 and 25 are exposed. The pair of terminals 24 and 25 are electrically connected to the connection electrodes 62a and 62b installed in the package 5 via interconnections 81a and 81b which are wire interconnections (bonding wires). The joint 23 is configured to include a plurality of joints of two types of different metals or semiconductors that generate the Peltier effect by conduction from the pair of terminals 24 and 25.

In the Peltier device 2, one of the substrates 21 and 22 serves as a heat generator side and the other substrate serves as a heat absorber side by the Peltier effect generated in the joint 23. Here, in the Peltier device 2, according to a direction of a current to be supplied, a state in which the substrate 21 serves as the heat generator side and the substrate 22 serves as the heat absorber side and a state in which the substrate 21 serves as the heat absorber side and the substrate 22 serves as the heat generator side can be switched. Therefore, even when the range of an environmental temperature is broad, the temperature of the light-emitting element 3 or the like can be adjusted to a preferred temperature (target temperature). In this way, it is possible to further reduce an adverse influence (for example, a variation in the wavelength of the light LL) due to a change in temperature. Here, the target temperature of the light-emitting element 3 can be decided according to the characteristics of the light-emitting element 3 and is not particularly limited. For example, the target temperature is equal to or greater than about 30° C. and equal to or less than about 40° C. The Peltier device 2 is operated at an appropriate timing based on information from the temperature sensor 4 to heat or cool the light-emitting element 3 so that the temperature of the light-emitting element 3 is maintained as the target temperature.

The Peltier device 2 includes a metal layer 26 installed on the upper surface of the substrate 22. The metal layer 26 is formed of, for example, a metal having excellent thermal conductivity, such as aluminum, gold, or silver. The light-emitting element 3, the temperature sensor 4, and relay members 71 and 72 are disposed on the upper surface of the metal layer 26.

The light-emitting element 3 is, for example, a semiconductor laser such as a vertical cavity surface emitting laser (VCSEL). The semiconductor layer can emit two types of light with different wavelengths by superimposing a high-frequency signal on a direct-current bias current (performing modulation) for use. The light-emitting element 3 includes a pair of terminals (not illustrated). Of the pair of terminals, one terminal is a drive signal terminal and the other terminal is a grounding terminal. The drive signal terminal is electrically connected to the connection electrode 62c installed in the package 5 via the interconnection 82a, the relay member 71, and the interconnection 82b. On the other hand, the grounding terminal is electrically connected to the connection electrode 62d installed in the package 5 via the interconnection 82c, the metal layer 26, and the interconnection 82d.

The temperature sensor 4 is, for example, a temperature detection element such as a thermistor or a thermocouple. The temperature sensor 4 includes a pair of terminals (not illustrated). Of the pair of terminals, one terminal is a detection signal terminal and the other terminal is a grounding terminal. The detection signal terminal is electrically connected to the connection electrode 62e installed in the package 5 via the interconnection 83a, the relay member 72, and the interconnection 83b. On the other hand, the grounding terminal is electrically connected to the connection electrode 62f installed in the package 5 via the metal layer 26 and the interconnection 83c.

The interconnections 82a, 82b, 82c, 82d, 83a, 83b, and 83c are wire interconnections (bonding wires). Here, the interconnection 82b is configured by a plurality of wire interconnections. In this way, it is possible to reduce electric resistance of the interconnection 82b and reduce loss of a driving signal supplied to the light-emitting element 3. From the same viewpoint, the interconnections 82c and 82d are also configured by a plurality of wire interconnections.

The relay member 71 includes a base portion 711 that has an insulation property and an interconnection layer 712 that has conductivity and is installed on the upper surface of the base portion 711. The base portion 711 is formed of, for example, a ceramics material. A metal layer (not illustrated) is joined to the lower surface of the base portion 711. The metal layer is joined to the metal layer 26 with a joining material (not illustrated) such as a brazing filter metal. The interconnection layer 712 is formed of the same material as that of the above-described connection electrodes 62a to 62f. The interconnection layer 712 is formed in a rectangular shape and is formed in a part of the upper surface of the base portion 711. In this way, even when an electrostatic capacitance between the interconnection layer 712 and the metal layer 26 is small and a high-frequency signal is used as a driving signal supplied to the light-emitting element 3, it is possible to reduce loss of the driving signal. In addition, it is possible to ensure the size of the base portion 711 to some extent and consequently facilitate mounting of the relay member 71.

By electrically connecting the light-emitting element 3 to the connection electrodes 62c and 62d via the relay member 71 and the like, the temperature of the interconnections 82a, 82b, 82c, and 82d is adjusted by the Peltier device 2. Therefore, it is possible to reduce the variation in the temperature of the interconnections 82a, 82b, 82c, and 82d and also accordingly reduce the variation in the temperature of the light-emitting element 3.

The relay member 72 can be configured similarly to the above-described relay member 71. However, since no high-frequency signal is used in the temperature sensor 4, the interconnection layer included in the relay member 72 may be installed across the entire region of the upper surface of the base portion.

By electrically connecting the temperature sensor 4 to the connection electrodes 62e and 62f via the relay member 72 and the like, the temperature of the interconnections 83a, 83b, and 83c is adjusted by the Peltier device 2. Therefore, it is possible to reduce the variation in the temperature of the interconnections 83a, 83b, and 83c and also accordingly reduce the variation in the temperature of the temperature sensor 4. That is, the temperature sensor 4 can be allowed to be rarely affected by heat from the connection electrodes 62e and 62f. Therefore, it is possible to improve detection precision of the temperature sensor 4 and consequently control the temperature of the light-emitting element 3 with high precision.

As illustrated in FIG. 4, the above-described light-emitting element module 1 includes the light-emitting element 3 that emits the light LL, the base 51 that includes the depression portion 511 in which the light-emitting element 3 is accommodated, and the lid 52 that covers the opening of the depression portion 511 and is joined to the base 51. The lid 52 includes the protrusion portion 55 that protrudes on an opposite side to the base 51 and has the hole 551 through which the light LL passes and the window 56 that is installed to block the hole 551 in the protrusion portion 55 and transmits the light LL. The surface 560 (the lower surface) of the window 56 on the side of the light-emitting element 3 is inclined with respect to the surface having the optical axis a of the light LL as the normal line, that is, the plate surface 540 of the body portion 54.

In the light-emitting element module 1 according to the disclosure, the surface 560 of the window 56 on the side of the light-emitting element 3 is inclined with respect to the surface (the plate surface 540) having the optical axis a of the light LL as the normal line. Therefore, it is possible to reduce return light returning to the light-emitting element 3 by reflecting the light LL from the light-emitting element 3 to the window 56. Further, since the window 56 is installed in the protrusion portion 55, a separation distance between the window 56 and the light-emitting element 3 can be increased. Therefore, it is possible to lower a light amount density and thus effectively reduce the return light in association with traveling of the light LL from the light-emitting element 3. In the light-emitting element module 1, by installing the window 56 in the protrusion portion 55, it is possible to miniaturize the entire light-emitting element module 1 further than, for example, when the lid 52 does not include the protrusion portion 55 and the depression portion 511 of the base 51 is enlarged (deepened) to increase the separation distance between the window 56 and the light-emitting element 3. In this way, in the light-emitting element module 1, it is possible to reduce the influence of the return light on the light-emitting element 3 while reducing an increase in its size.

An inclination angle θ of the surface 560 of the window 56 on the side of the light-emitting element 3 with respect to the surface having the optical axis a of the light LL as the normal line is preferably equal to or greater than 5° and equal to or less than 45°, is more preferably equal to or greater than 7° and equal to or less than 40°, is further more preferably equal to or greater than 10° and equal to or less than 30°. In particular, in the embodiment, the inclination angle θ is 15°. Since the inclination angle θ is within the above-described range, it is possible to reduce the influence of the return light on the light-emitting element 3 (for example, the variation in the wavelength of the light LL due to an increase in temperature) on the light-emitting element 3 while exerting necessary optical characteristics (for example, sufficient transmittance of the light LL) of the window 56.

An inclination direction of the surface 560 of the window 56 on the side of the light-emitting element 3 is not limited to the illustrated direction. For example, the window 56 may be rotated clockwise at 30°, 60°, 90°, 180°, or 210° to be disposed in FIG. 6.

As described above, the inner wall surface of the hole 551 of the protrusion portion 55 is inclined with respect to the surface having the optical axis a of the light LL as the normal line and includes the stepped portion 553 supporting the window 56. In this way, it is easy to dispose the window at an appropriate position and the above-described inclination angle θ with respect to the protrusion portion 55.

Here, as described above, the light LL emitted by the light-emitting element 3 spreads at the predetermined angle of radiation (a spreading angle when the optical axis a of the light LL is a central axis) to be emitted. When W [mm] is assumed to be the width (diameter) of the light on the surface along the opening of the hole 551 on the side of the base 51 at the intensity of $1/e^2$ (where e is a base of natural logarithm) of the peak intensity of the light LL, the width (diameter) L [mm] of the opening of the hole 551 on the side of the base 51 preferably satisfies a range of W<L<20×W, more preferably satisfies a range of 2×W<L<18×W, and further more preferably satisfies a range of 5×W<L<15×W. In particular, in the embodiment, the width L is 5.4×W. Since the width L is within the above-described range, it is possible to cause the central portion of the light LL emitted from the light-emitting element 3 except for the outer circumference in which a change in an energy density is large to be effectively incident on the hole 551 while reducing an excessive increase in the size of the protrusion portion 55.

As described above, the lid 52 includes the first portion 54a supporting the protrusion portion 55 and the second portion 54b joined to the base 51 and having a thickness less than that of the first portion 54a. In this way, since the second portion 54b joined to the base 51 is thinner than the first portion 54a, it is possible to easily join the lid 52 to the base 51 by seam welding or the like. In addition, since the first portion 54a is thicker than the second portion 54b, it is possible to ensure a necessary mechanical strength of the lid 52. In addition, since the first portion 54a is thicker than the second portion 54b, it is possible to reduce stress occurring in the first portion 54a at the time of joining the base 51 to the lid 52 and reduce separation of the window 56 from the protrusion portion 55.

As described above, the outer circumferential surface of the protrusion portion 55 has the flat portion 554 that is flat and formed along the external shape of the first portion 54a when viewed in the direction along the optical axis a of the light LL. In particular, in the embodiment, the outer circumferential surface of the protrusion portion 55 includes one pair of the flat portions 554. In this way, when the base 51 and the second portion 54b of the lid 52 are joined, it is possible to reduce interference of the protrusion portion 55. Therefore, the lid 52 and the base 51 can be more easily joined. In the embodiment, one pair of the curve surfaces 555 are installed between one pair of the flat portions 554. Since the curve surfaces 555 are included, it is possible to ensure a necessary mechanical strength of the protrusion portion 55.

The atomic oscillator 10 has been described above. The atomic oscillator 10 includes the above-described light-emitting element module 1. Thus, it is possible to reduce the influence of the return light on the light-emitting element 3 while reducing an increase in its size. Therefore, it is possible to reduce the variation in the wavelength of the light LL from the light-emitting element 3, and thus realize the atomic oscillator 10 having excellent oscillation characteristics using the light LL.

As described above, the atomic oscillator 10 includes the light reduction filter 301, the lens 302, and the quarter wavelength plate 303 which are "optical elements" passing the light LL from the light-emitting element 3, and the holder 304 that holds them. The holder 304 includes the through-hole 305 into which the protrusion portion 55 included in the light-emitting element module 1 is inserted. Thus, by inserting the protrusion portion 55 into the through-hole 305 of the holder 304, it is possible to relatively position the light-emitting element module 1 and the holder 304 simply and with high precision. Therefore, the light LL emitted from the light-emitting element module 1 can be appropriately incident on the light reduction filter 301. By bringing the body portion 54 and the protrusion portion 55 into contact with the holder 304 in this way, it is possible reduce an increase in the temperature of the lid 52 by dissipation from the holder 304 that is formed of a metal material and has an excellent heat dissipation property.

Second Embodiment

Figure 7:
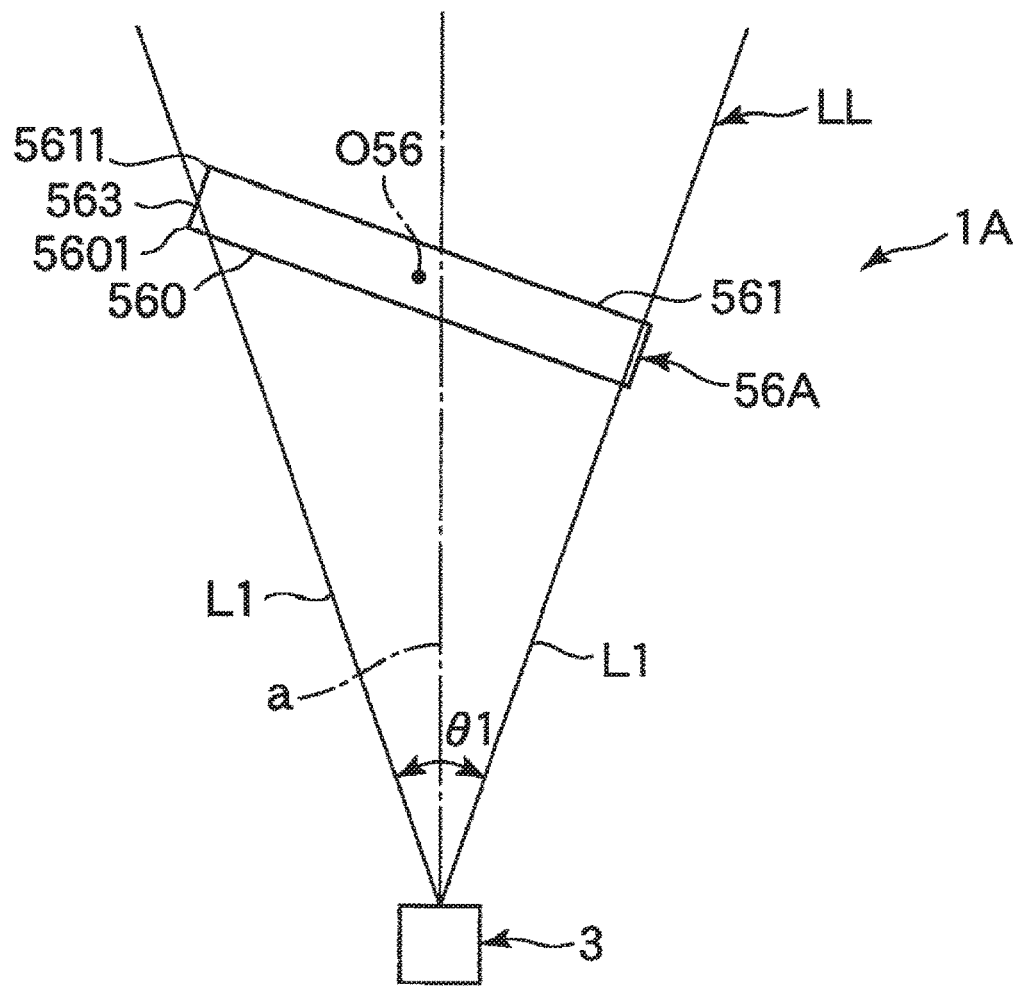
FIG. 7 is a schematic diagram illustrating a light-emitting element and a window of a light-emitting element module included in an atomic oscillator according to a second embodiment.
Figure 8:
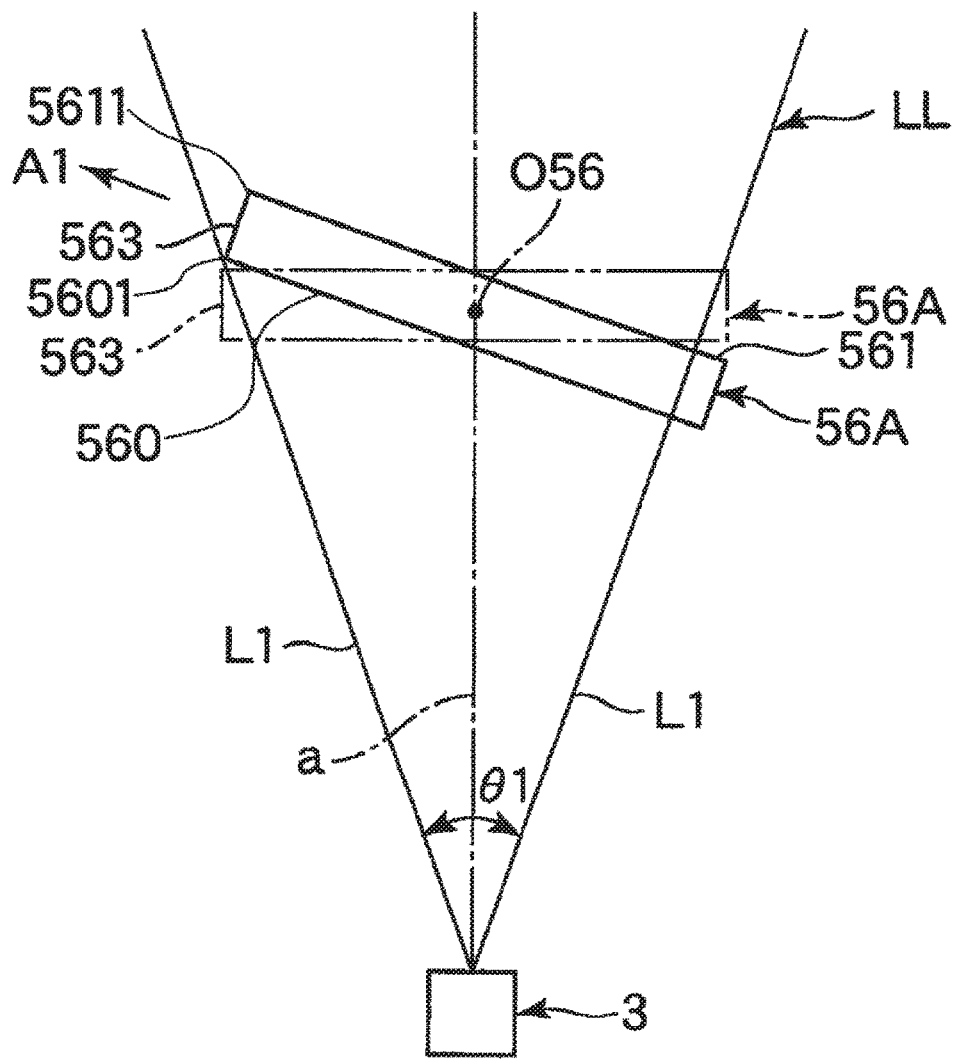
FIG. 8 is a diagram illustrating a state in which the center of the window matches an optical axis of light.
Figure 9:
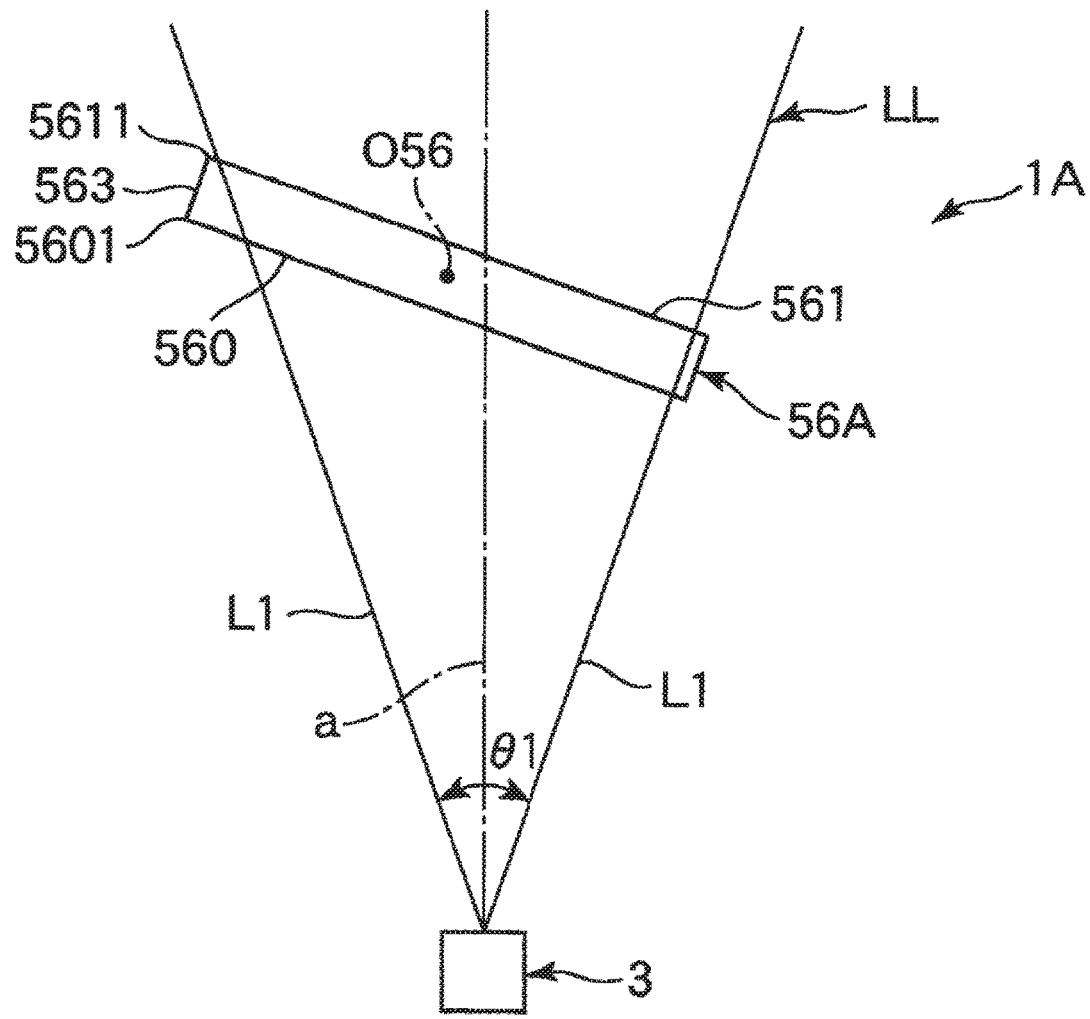
FIG. 9 is a schematic diagram illustrating a modification example of disposition of the window illustrated in FIG. 7.

FIG. 7 is a schematic diagram illustrating a light-emitting element and a window of a light-emitting element module included in an atomic oscillator according to a second embodiment. FIG. 8 is a diagram illustrating a state in which the center of the window matches an optical axis of light. FIG. 9 is a schematic diagram illustrating a modification example of disposition of the window illustrated in FIG. 7.

In the following description, differences between the second embodiment and the above-described embodiment will be mainly described. The same factors will not be described. In FIGS. 7, 8, and 9, the same reference numerals are given to the same configurations as those of the above-described embodiment.

In a light-emitting element module 1A illustrated in FIG. 7, a geometric center O56 of the window 56A deviates from the optical axis a without matching the optical axis a of the light LL. Like the window 56 according to the first embodiment, the window 56A is a member that has a hexagonal plate shape in a plan view and the surface 560 is inclined with respect to a surface having the optical axis a as a normal line. A part of a side surface 563 (an outer circumferential surface) of the window 56A is located outside of a light flux L1 of the light LL. Specifically, an edge 5601 (outer circumference) of the surface 560 (an incident side surface) of the window 56A is located outside of the light flux L1 of the light LL across the entire circumference. The light flux L1 is inside a line withdrawn at an angle of radiation θ1. The "angle of radiation" refers to an angle at $1/e^2$ of the peak intensity of the light LL, as described above. When the cross-sectional intensity distribution of the light LL does not form the Gaussian distribution, the "angle of radiation" refers to an angle at half of the peak intensity of the light LL.

Here, when the window 56A is changed from a state indicated by a two-dot chain line in FIG. 8 to a state indicated by a solid line in FIG. 8, that is, when the window 56A is inclined with the center O56 located on the optical axis a without changing the position of the center O56, a portion through which the light LL does not pass is formed in the window 56A. In FIG. 8, in a distal portion of the window 56A from the light-emitting element 3 (a portion on the left side of the window 56A indicated by a solid line in FIG. 8), the light LL does not pass through the window 56A. The portion of the light LL not passing through the window 56A is absorbed into or reflected by a portion other than the window 56A of the lid 52 (see FIG. 4). Thus, the amount (light amount) of light LL emitted from the window 56A is reduced or the portion of the light LL not passing through the window 56A is diffusely reflected to reach the light-emitting element 3 or the atomic cell 201, so that the light-emitting element 3 or the atomic cell 201 is unexpectedly affected (see FIGS. 2 and 3).

To reduce the influence of the portion of the light LL not passing through the window 56A, as described above, the window 56A is disposed in the embodiment, as illustrated in FIG. 7. It is possible to locate the window 56A at the position illustrated in FIG. 7 by moving the window 56A in a direction indicted by an arrow A1 from the position of the window 56A indicted by a solid line in FIG. 8.

Specifically, as described above, the center O56 of the window 56A deviates from the optical axis a of the light LL. In this way, it is possible to locate the edge 5601 of the surface 560 of the window 56A outside of the light flux L1 of the light LL even when the size of the window 56A (plane area of the surface 560) is not changed from the size of the window 56A indicated by the two-dot chain line in FIG. 8 and the window 56A indicated by the solid line in FIG. 8. That is, the edge 5601 of the surface 560 can be located outside of the light flux L1 of the light LL with the minimum size of the window 56A. In this way, it is possible to reduce occurrence of the light LL not passing through the window 56A while reducing an increase in the size of the window 56A. Therefore, it is possible to appropriately pass the light LL (specifically, a portion of $1/e^2$ or ½ or more of a maximum light amount intensity of the light LL) through the window 56A. As a result, it is possible to reduce an adverse influence on the light-emitting element 3 or the like due to a decrease in the light amount of the light LL output from the window 56A or diffused reflection of the light LL deviating from the window 56A. Since the size of the window 56A can be reduced, the plurality of windows 56A can be manufactured from one substrate (for example, a sheet-shaped glass substrate). Therefore, it is possible to achieve low cost or an improvement in productivity.

By enlarging the size of the window 56A (the plane area of the surface 560) with the center O56 of the window 56A located on the optical axis a, the edge 5601 may be located outside of the light flux L1.

FIG. 9 illustrates a modification example of the window 56A according to the embodiment. In FIG. 9, the side surface 563 (the entire region of the side surface 563) of the window 56A is located outside of the light flux L1 of the light LL. In other words, the edge 5601 of the surface 560 and an edge 5611 of the surface 561 (emission side surface) are each located outside of the light flux L1 of the light LL. In this way, since the light LL can pass through both main surfaces (the surfaces 560 and 561) of the window 56A, it is possible to reduce the diffused reflection of the light LL from the side surface 563 of the window 56A.

Here, the side surface 563 of the window is a surface except for both main surfaces (the surfaces 560 and 561) and is a surface connecting both main surfaces (the surfaces 560 and 561). The surface 560 is a main surface of the window 56A which is located on the side of the light-emitting element 3 and on which the light LL is incident. On the other hand, the surface 561 is a main surface of the window 56A which is located to be opposite to the light-emitting element 3 and from which the light LL is emitted.

A case in which the side surface 563 is located outside of the light flux L1 includes a case in which a part of the side surface 563 is located outside of the light flux L1.

As described above, in the window 56A illustrated in FIGS. 7 and 9, it is also possible to reduce the return light returning to the light-emitting element 3 when the light LL from the light-emitting element 3 is reflected from the window 56A.

Third Embodiment

Figure 10:
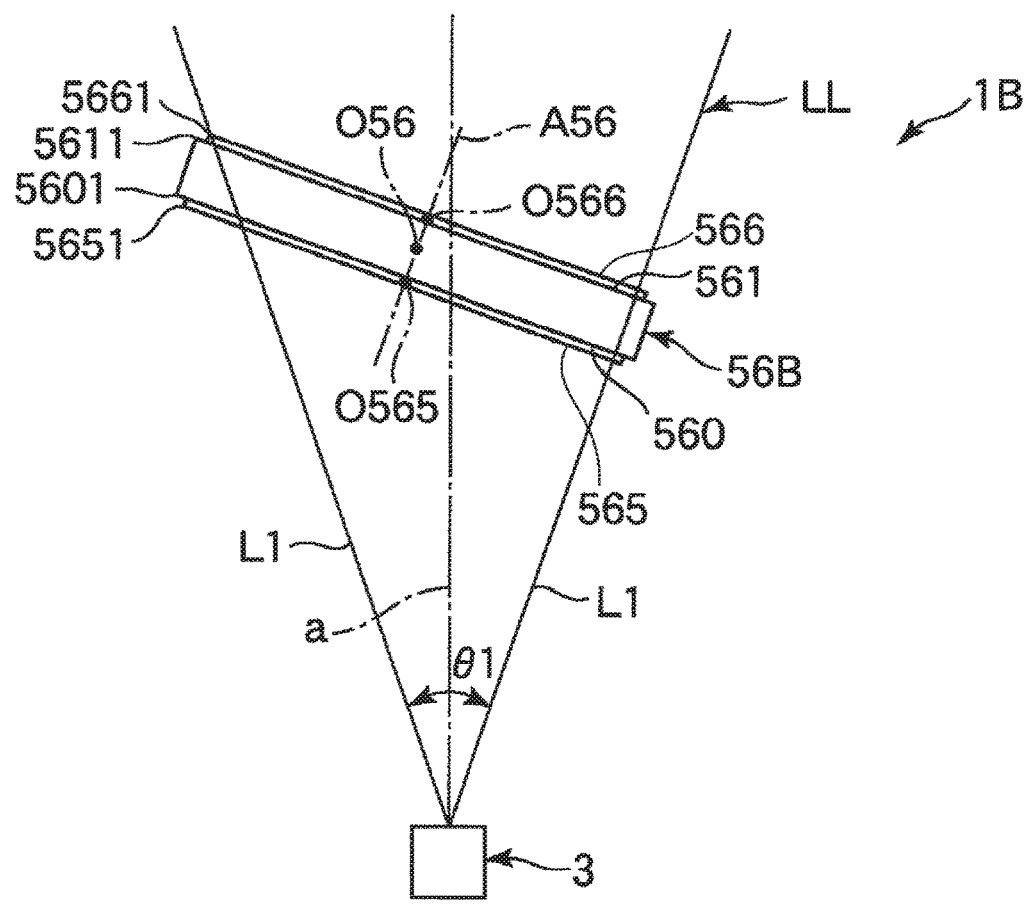
FIG. 10 is a schematic diagram illustrating a light-emitting element and a window of a light-emitting element module included in an atomic oscillator according to a third embodiment.
Figure 11:
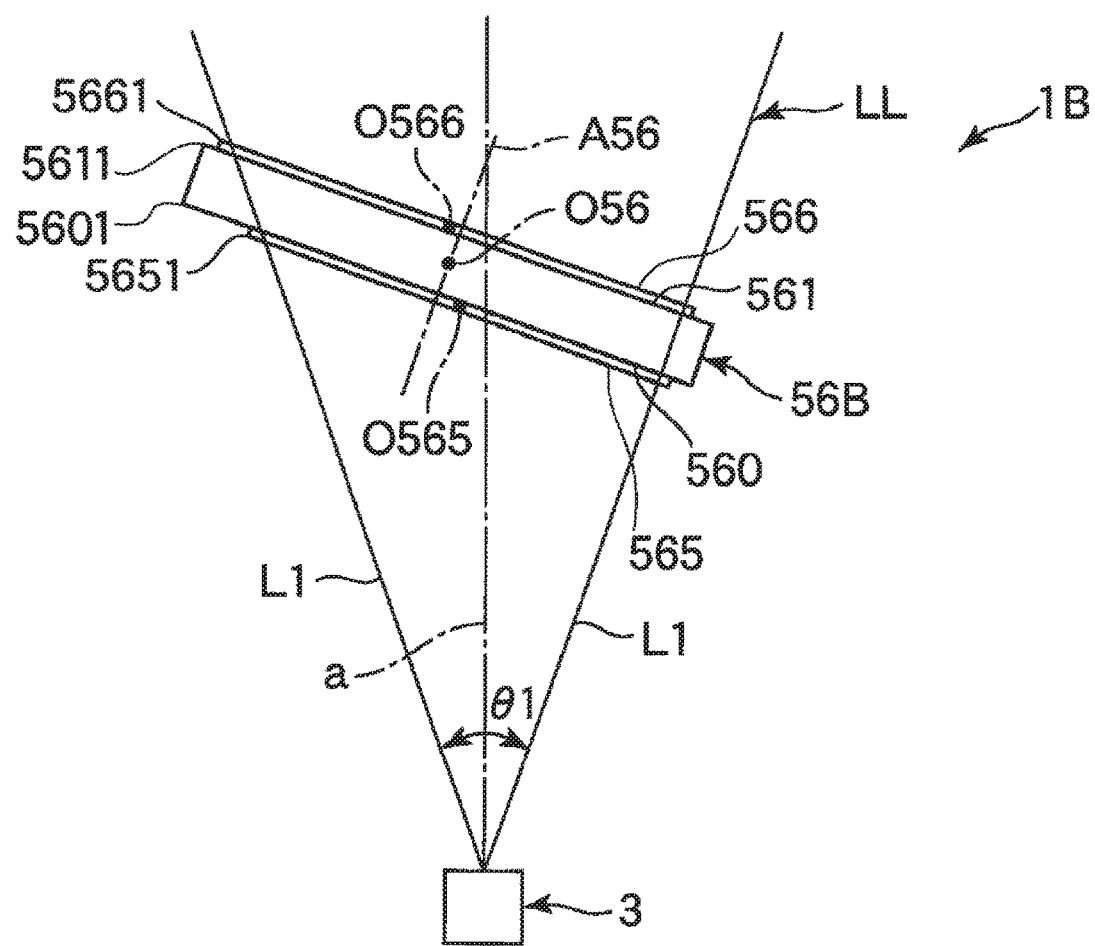
FIG. 11 is a schematic diagram illustrating a modification example of the window illustrated in FIG. 10.

FIG. 10 is a schematic diagram illustrating a light-emitting element and a window of a light-emitting element module included in an atomic oscillator according to a third embodiment. FIG. 11 is a schematic diagram illustrating a modification example of the window illustrated in FIG. 10.

In the following description, differences between the third embodiment and the above-described embodiments will be mainly described. The same factors will not be described. In FIGS. 10 and 11, the same reference numerals are given to the same configurations as those of the above-described embodiments.

In a light-emitting element module 1B illustrated in FIG. 10, coating films 565 and 566 are formed on both main surfaces (surfaces 560 and 561) of the window 56B. The window 56B has the same configuration as the window 56A illustrated in FIG. 9. The coating films 565 and 566 are configured of, for example, antireflective films (AR coating). In this way, it is possible to reduce reflection of the light LL from the light-emitting element 3 by the window 56B. Therefore, since a reduction in the light amount of the light LL passing through the window 56B can be reduced, it is possible to increase the light amount of the light LL reaching the atomic cell 201 (see FIGS. 2 and 3). The coating films 565 and 566 are not limited to the antireflective films, but may be configured of films that have other functions.

The coating film 565 is formed nearly on the entire region of the surface 560 (the incident side surface) of the window 56B (a portion except for the edge 5601). Similarly, the coating film 566 is formed nearly on the entire region of the surface 561 (the emission side surface) (a portion except for the edge 5611). A center O565 of the coating film 565 and a center O566 of the coating film 566 are located on a central axis A56 of the window 56B. In addition, the centers O565 and O566 are not located on the optical axis a and deviate from the optical axis a. The central axis A56 is an axis that passes the center O56 of the window 56B and is along the thickness direction of the window 56B.

An edge 5651 of the coating film 565 is located outside of the light flux L1 of the light LL across the entire circumference. Similarly, an edge 5661 of the coating film 566 is located outside of the light flux L1 of the light LL across the entire circumference. In this way, since the light LL can pass through the coating films 565 and 566 more appropriately, it is possible to reduce reflected light from the window 56B to the light-emitting element 3. Therefore, it is possible to increase the light amount of the light LL reaching the atomic cell 201. In addition, it is possible to reduce an adverse influence of the reflected light reaching the light-emitting element 3 or the atomic cell 201.

FIG. 11 illustrates a modification example of the window 56B including the coating films 565 and 566 according to the embodiment. In FIG. 11, the coating films 565 and 566 are disposed according to regions through which the light LL passes. Specifically, the center O565 of the coating film 565 is located on the right side of the central axis A56 of the window 56B in FIG. 11. On the other hand, the center O566 of the coating film 566 is located on the left side of the central axis A56 of the window 56B in FIG. 11. That is, the center O565 of the coating film 565 and the center O566 of the coating film 566 deviate from each other in reference to the central axis A56 in mutually opposite directions of the central axis A56.

As described above, in the window 56B including the coating films 565 and 566 illustrated in FIGS. 10 and 11, it is also possible to reduce the return light returning to the light-emitting element 3 when the light LL from the light-emitting element 3 is reflected from the window 56B.

Any one of the coating films 565 and 566 may be appropriately omitted. However, by forming both the coating films 565 and 566, it is possible to further improve the effect of reducing the adverse influence of the reflected light.

Fourth Embodiment

Figure 12:
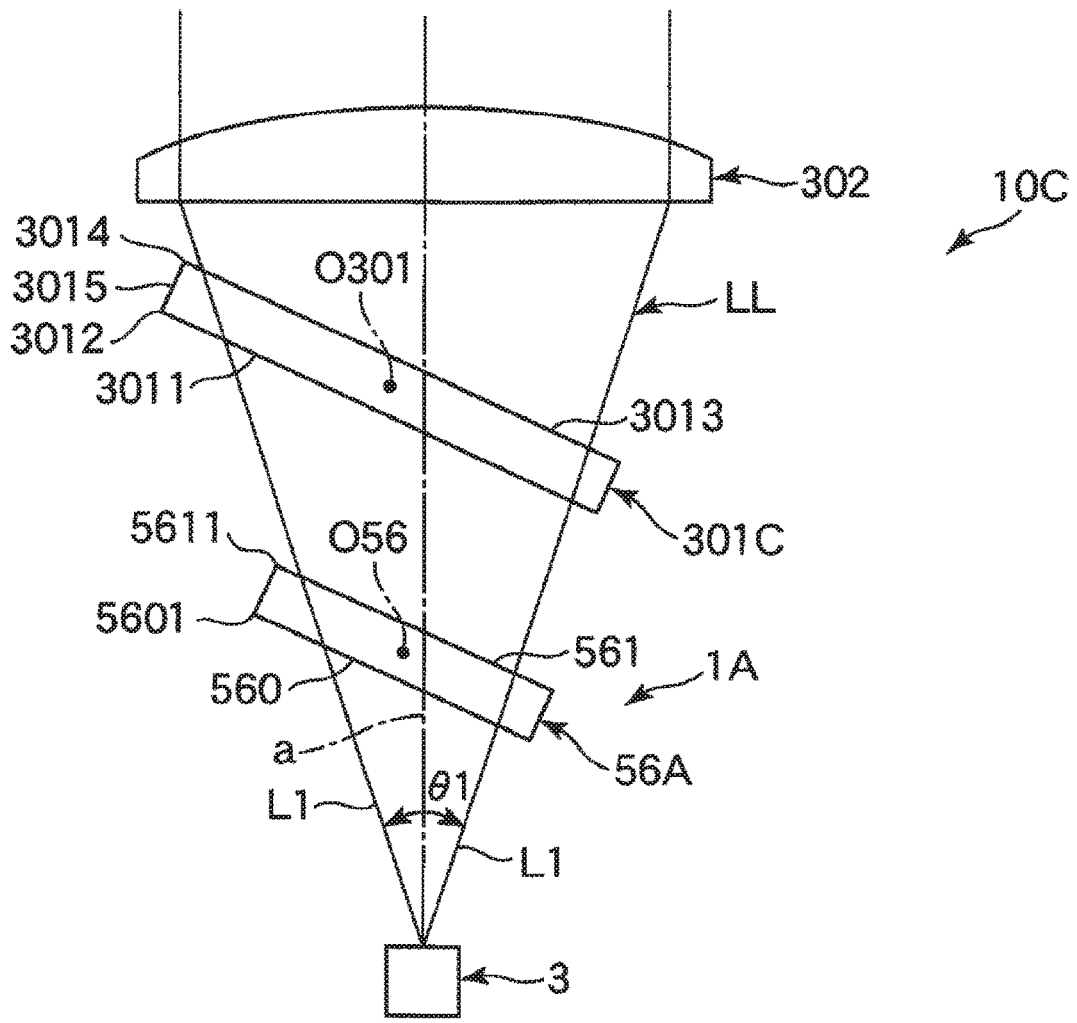
FIG. 12 is a schematic diagram illustrating an optical system unit and a window of a light-emitting element module included in an atomic oscillator according to a fourth embodiment.

FIG. 12 is a schematic diagram illustrating an optical system unit and a window of a light-emitting element module included in an atomic oscillator according to a fourth embodiment.

In the following description, differences between the fourth embodiment and the above-described embodiments will be mainly described. The same factors will not be described.

In FIG. 12, the same reference numerals are given to the same configurations as those of the above-described embodiments.

In an atomic oscillator 10C, as illustrated in FIG. 12, a geometric center O301 of a light reduction filter 301C included in an optical system unit 30 deviates from the optical axis a without matching the optical axis a. The light reduction filter 301C is a member that has a plate shape like the light reduction filter 301 in the first embodiment and is inclined with respect to a surface having the optical axis a as a normal line. A side surface 3015 (an outer circumferential surface) of the light reduction filter 301C is located outside of the light flux L1 of the light LL. In other words, an edge 3012 of a surface 3011 of the light reduction filter 301C on the side of the window 56A and an edge 3014 of a surface 3013 of the light reduction filter 301C opposite to the window 56A are each located outside of the light flux L1 of the light LL.

Here, as illustrated in FIG. 12, the window 56A is installed between the light-emitting element 3 and the light reduction filter 301C serving as an "optical element". The surface 3011 of the light reduction filter 301C on the side of the window 56A is inclined with respect to the surface having the optical axis a of the light LL as the normal line and the center O301 of the light reduction filter 301C deviates from the optical axis a of the light LL. In this way, even when the size of the light reduction filter 301C (the plane area of the surface 3011) is not excessively large like the window 56A, the side surface 3015 of the light reduction filter 301C can be located outside of the light flux L1 of the light LL. Therefore, it is possible to more effectively reduce deterioration in the light amount of the light LL output from the light reduction filter 301C while reducing an increase in the size of the light reduction filter 301C. As a result, it is possible to exert excellent oscillation characteristics using the light LL by increasing the light amount of the light LL reaching the atomic cell 201 while reducing the increase in the size of the atomic oscillator 10C.

In this way, when the "optical element" disposed within a range of the angle of radiation of the light LL is inclined with respect to the optical axis a, shifting the geometric center of the "optical element" from the optical axis a is effective. Therefore, even when an "optical element" other than the window 56A or the light reduction filter 301C is disposed to be inclined with respect to the optical axis a within the range, disposing the geometric center of the "optical element" at a position deviating from the optical axis a is effective.

When the light LL has the angle of radiation again even in a region in which the light LL has passed through the lens 302 (for example, parallel light passes through the lens and has the angle of radiation), it is desirable to dispose the geometric center of the "optical element" passing the light LL having the angle of radiation at a position deviating from the optical axis a.

Even in the atomic oscillator 10C including the light reduction filter 301C illustrated in FIG. 12, as described above, it is possible to reduce the influence of the return light on the light-emitting element 3 while reducing an increase in its size. Therefore, it is possible to realize the atomic oscillator 10C with improved characteristics using the high-quality light LL.

2. Electronic Apparatus

The light-emitting element modules 1, 1A, and 1B and the atomic oscillators 10 and 10C described above can be embedded in various electronic apparatus. Hereinafter, an electronic apparatus according to the disclosure will be described.

Figure 13:
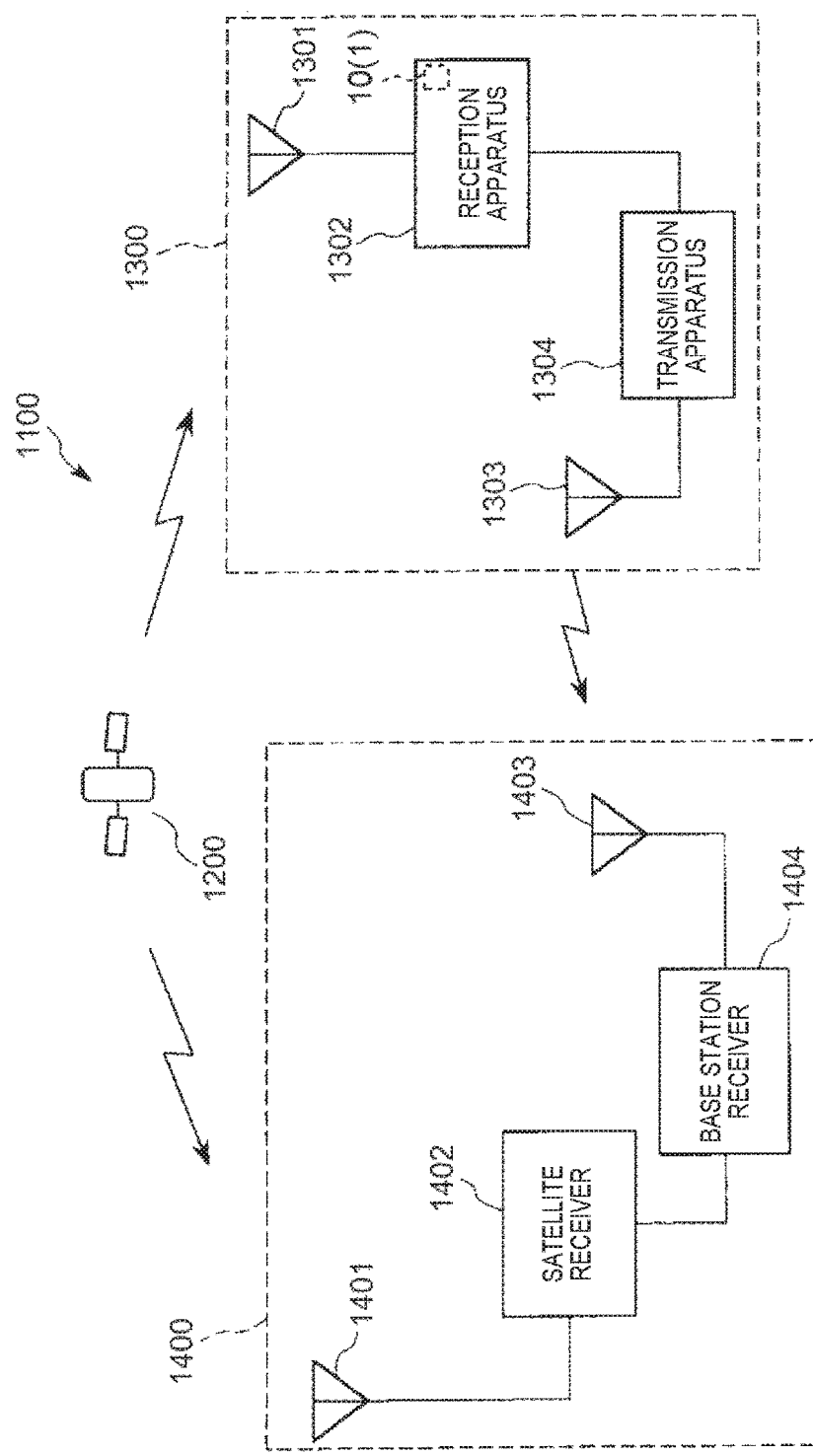
FIG. 13 is a diagram illustrating a schematic configuration when the atomic oscillator according to the disclosure is used in a positioning system using GPS satellites.

FIG. 13 is a diagram illustrating a schematic configuration when the atomic oscillator according to the disclosure is used in a positioning system using GPS satellites.

A positioning system 1100 illustrated in FIG. 13 is configured to include a GPS satellite 1200, a base station apparatus 1300, and a GPS reception apparatus 1400.

The GPS satellite 1200 transmits positioning information (a GPS signal).

The base station apparatus 1300 includes a reception apparatus 1302 that receives the positioning information with high precision from the GPS satellite 1200 via an antenna 1301 installed at, for example, an electronic standard point (GPS continuous observation station) and a transmission apparatus 1304 that transmits the positional information received by the reception apparatus 1302 via an antenna 1303.

Here, the reception apparatus 1302 is an electronic apparatus that includes the above-described atomic oscillator (the light-emitting element module 1) according to the disclosure as a standard frequency oscillation source. The positional information received by the reception apparatus 1302 is transmitted in real time by the transmission apparatus 1304.

The GPS reception apparatus 1400 includes a satellite receiver 1402 that receives the positioning information from the GPS satellite 1200 via an antenna 1401 and a base station receiver 1404 that receives the positional information from the base station apparatus 1300 via an antenna 1403.

The reception apparatus 1302 which is an "electronic apparatus" included in the foregoing positioning system 1100 includes the above-described light-emitting element module 1 (or the light-emitting element module 1A or 1B). In this way, it is possible to reduce an influence of return light on the light-emitting element 3 while reducing an increase in its size. Therefore, it is possible to realize the reception apparatus 1302 with high characteristics in which the light LL from the light-emitting element 3 is used.

The electronic apparatus including the light-emitting element module according to the disclosure is not limited to the above-described electronic apparatus. The disclosure can be applied to, for example, a smartphone, a tablet terminal, a timepiece, a mobile phone, a digital still camera, an ink jet ejection apparatus (for example, an ink jet printer), a personal computer (a mobile personal computer or a laptop personal computer), a television, a video camera, a video tape recorder, a car navigation apparatus, a pager, an electronic organizer (also including a communication function unit), an electronic dictionary, a calculator, an electronic game apparatus, a word processor, a workstation, a television telephone, a security television monitor, electronic binoculars, a POS terminal, a medical apparatus (for example, an electronic thermometer, a blood-pressure meter, a blood-sugar meter, an electrocardiographic apparatus, an ultrasonic diagnostic apparatus, or an electronic endoscopy), a fish finder, various measurement apparatuses, meters (for example, meters for cars, airplanes, and ships), a flight simulator, a digital terrestrial broadcast, and a mobile phone base station.

3. Vehicle

Figure 14:
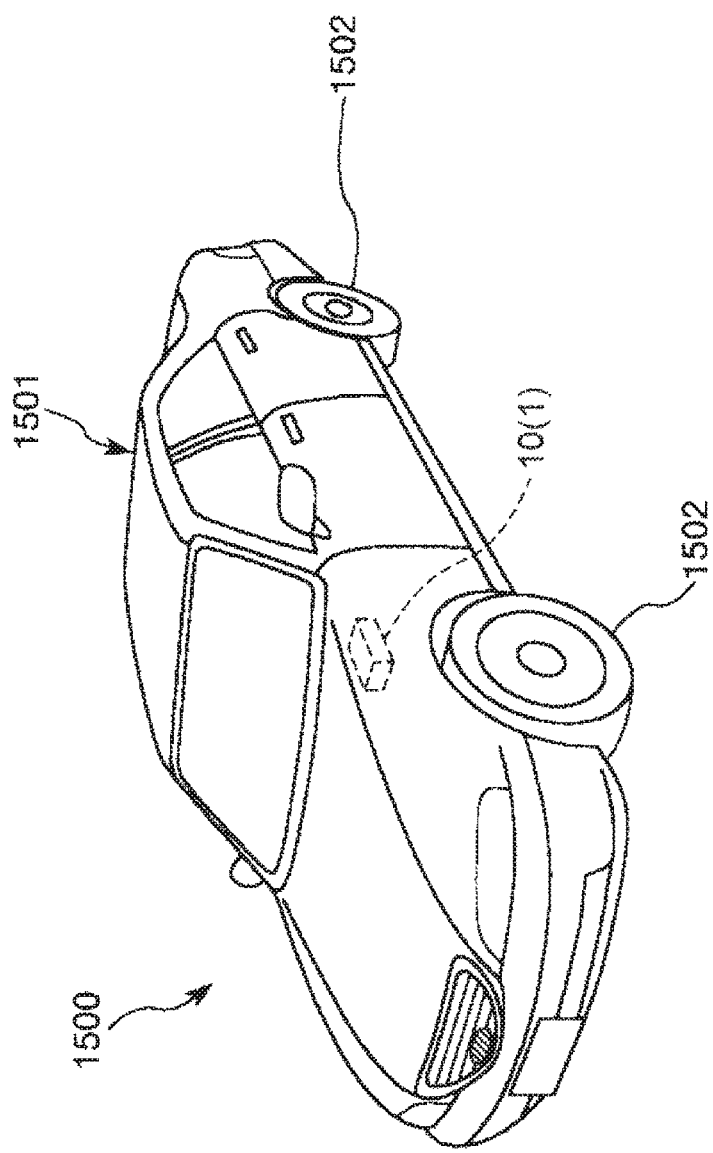
FIG. 14 is a diagram illustrating an example of a vehicle according to the disclosure.

FIG. 14 is a diagram illustrating an example of a vehicle according to the disclosure.

In the drawing, a vehicle 1500 includes a body 1501 and four wheels 1502 and is configured to rotate the wheels 1502 by a power source (engine) (not illustrated) installed in the body 1501. The vehicle 1500 contains the atomic oscillator 10 (the light-emitting element module 1).

The above-described vehicle 1500 includes the above-described light-emitting element module 1 (or the light-emitting element module 1A or 1B). In this way, it is possible to reduce an influence of return light on the light-emitting element 3 while reducing an increase in its size. Therefore, it is possible to realize the vehicle 1500 with high characteristics in which the light LL from the light-emitting element 3 is used.

The light-emitting element module, the atomic oscillator, the electronic apparatus, and the vehicle according to the disclosure have been described above according to the illustrated embodiments, but the disclosure is not limited thereto.

The configuration of each unit according to the disclosure can be replaced with any configuration that has the same function as that according to the above-described embodiment and any configuration can also be added.

In the above-described embodiments, the case in which the disclosure is applied to the atomic oscillator that resonates and transitions cesium or the like using coherent population trapping by two types of light with different wavelengths has been described, but the disclosure is not limited thereto. The disclosure is also applicable to an atomic oscillator that resonates and transitions rubidium or the like using a double resonance phenomenon by light and microwaves.

In the above-described embodiment, the case in which the light-emitting element module according to the disclosure is used in the atomic oscillator has been described, but the disclosure is not limited thereto. The light-emitting element module can be used for all devices that adopt a light-emitting element. For example, the light-emitting element module according to the disclosure is also applicable to a magnetic sensor and a quantum memory.

What is claimed is:

1. A light-emitting element module comprising:
    a base that has a depression portion;
    a light-emitting element that is accommodated in the depression portion and emits light; and
    a lid that covers an opening of the depression portion and is joined to the base,
    wherein the lid includes
        a protrusion portion having a hole through which the light passes and protruding to an opposite side to the base and
        a window blocking the hole and passing the light, and
    wherein a surface of the window on a side of the light-emitting element is inclined with respect to a surface perpendicular to an optical axis of the light.

2. The light-emitting element module according to claim 1,
    wherein an inclination angle of the surface of the window with respect to the surface perpendicular to the optical axis of the light is equal to or greater than 5° and equal to or less than 45°.

3. The light-emitting element module according to claim 1,
    wherein the lid includes
        a first portion supporting the protrusion portion, and
        a second portion joined to the base and having a thickness thinner than the first portion.

4. The light-emitting element module according to claim 3,
    wherein at least a part of an outer circumferential surface of the protrusion portion has a shape formed along an external shape of the first portion when viewed in a direction along the optical axis of the light.

5. The light-emitting element module according to claim 1,
    wherein an inner wall surface of the hole of the protrusion portion includes a stepped portion that is inclined with respect to the surface perpendicular to the optical axis of the light and supports the window.

6. The light-emitting element module according to claim 1,
    wherein when W [mm] is a width of the light on a surface along the opening of the hole on the side of the base at an intensity of $1/e^2$ (where e is a base of natural logarithm) of a peak intensity of the light, a width L [mm] of the opening of the hole on the side of the base satisfies $W<L<20\times W$.

7. The light-emitting element module according to claim 1,
wherein a center of the window deviates from the optical axis of the light.

8. The light-emitting element module according to claim 7,
wherein a side surface of the window is located further outward than a light flux of the light.

9. An atomic oscillator comprising:
a light-emitting element module comprising
a base that has a depression portion;
a light-emitting element that is accommodated in the depression portion and emits light; and
a lid that covers an opening of the depression portion and is joined to the base,
wherein the lid includes
a protrusion portion having a hole through which the light passes and protruding to an opposite side to the base and
a window blocking the hole and passing the light, and
wherein a surface of the window on a side of the light-emitting element is inclined with respect to a surface perpendicular to an optical axis of the light.

10. The atomic oscillator according to claim 9, further comprising:
an optical element that passes the light; and
a holder that holds the optical element and has a through-hole into which the protrusion portion is inserted.

11. The atomic oscillator according to claim 10,
wherein the window is disposed between the light-emitting element and the optical element,
wherein a surface of the optical element on a side of the window is inclined with respect to a surface perpendicular to an optical axis of the light, and
wherein a center of the optical element deviates from the optical axis of the light.

12. An electronic apparatus comprising:
the light-emitting element module according to claim 1.

* * * * *